US012672562B2

(12) United States Patent
Ecton et al.

(10) Patent No.: US 12,672,562 B2
(45) Date of Patent: Jun. 30, 2026

(54) CAVITY-LESS INTERCONNECT COMPONENT ON GLASS CORE

(71) Applicant: Intel Corporation, Santa Clara, CA (US)

(72) Inventors: Jeremy D. Ecton, Gilbert, AZ (US); Hiroki Tanaka, Gilbert, AZ (US); Brandon Christian Marin, Gilbert, AZ (US); Srinivas V. Pietambaram, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 17/900,692

(22) Filed: Aug. 31, 2022

(65) Prior Publication Data

US 2024/0071938 A1 Feb. 29, 2024

(51) Int. Cl.
| | |
|---|---|
| *H01L 21/68* | (2006.01) |
| *H10W 70/05* | (2026.01) |
| *H10W 70/60* | (2026.01) |
| *H10W 70/65* | (2026.01) |
| *H10W 70/685* | (2026.01) |
| *H10W 70/692* | (2026.01) |
| *H10W 90/00* | (2026.01) |
| *H10W 74/15* | (2026.01) |

(52) U.S. Cl.
CPC ........... *H10W 70/65* (2026.01); *H10W 70/05* (2026.01); *H10W 70/093* (2026.01); *H10W 70/095* (2026.01); *H10W 70/611* (2026.01); *H10W 70/685* (2026.01); *H10W 70/692* (2026.01); *H10W 90/00* (2026.01); *H10W*

*90/401* (2026.01); *H10W 74/15* (2026.01); *H10W 90/724* (2026.01); *H10W 90/734* (2026.01)

(58) Field of Classification Search
CPC ............. H01L 23/5381; H01L 21/4853; H01L 21/4857; H01L 21/486; H01L 23/15; H01L 23/49822; H01L 23/49833; H01L 23/49838; H01L 23/5385; H01L 23/5386; H01L 24/16; H01L 24/32; H01L 24/73; H01L 25/0655; H01L 2224/16227; H01L 2224/32225; H01L 2224/73204; H01L 2924/37001; H01L 2924/381; H01L 23/5383; H01L 25/50; H01L 24/08; H01L 23/5384; H01L 24/81
USPC ........................................... 257/690
See application file for complete search history.

(56) References Cited

U.S. PATENT DOCUMENTS

| | | | | | |
|---|---|---|---|---|---|
| 8,411,459 B2* | 4/2013 | Yu | ...................... | H01L 23/49827 |
| | | | | | 361/783 |
| 10,115,671 B2* | 10/2018 | Shenoy | ................... | H01L 25/50 |

(Continued)

OTHER PUBLICATIONS

U.S. Appl. No. 17/243,784, filed Apr. 29, 2021, Inventors Jeremy Ecton et al.

(Continued)

*Primary Examiner* — Vu A Vu
(74) *Attorney, Agent, or Firm* — Alliance IP, LLC

(57) ABSTRACT

A glass core with a cavity-less local interconnect component architecture for complex multi-die packages. The apparatus has the local interconnect component attached directly to a planar glass layer and surrounded by mold. One or more redistribution layers may be located above and below the apparatus.

25 Claims, 18 Drawing Sheets

(56) References Cited

U.S. PATENT DOCUMENTS

| 10,163,771 | B2 * | 12/2018 | Zuo | H01L 25/0657 |
| 10,971,476 | B2 * | 4/2021 | Gu | H01L 24/97 |
| 11,848,234 | B2 * | 12/2023 | Wu | H01L 25/0657 |
| 12,349,477 | B2 * | 7/2025 | Meng | H10F 39/8057 |
| 12,387,945 | B2 * | 8/2025 | Juang | H01L 23/49827 |
| 2018/0290882 | A1 * | 10/2018 | Rhee | B81C 1/00301 |
| 2021/0035911 | A1 * | 2/2021 | Ganesan | H01L 21/568 |
| 2021/0366863 | A1 * | 11/2021 | Wu | H01L 25/18 |
| 2023/0299049 | A1 * | 9/2023 | Deshpande | H01L 23/481 |

OTHER PUBLICATIONS

U.S. Appl. No. 17/482,830, filed Sep. 23, 2021, Inventors—Jeremy D. Ecton et al.

* cited by examiner

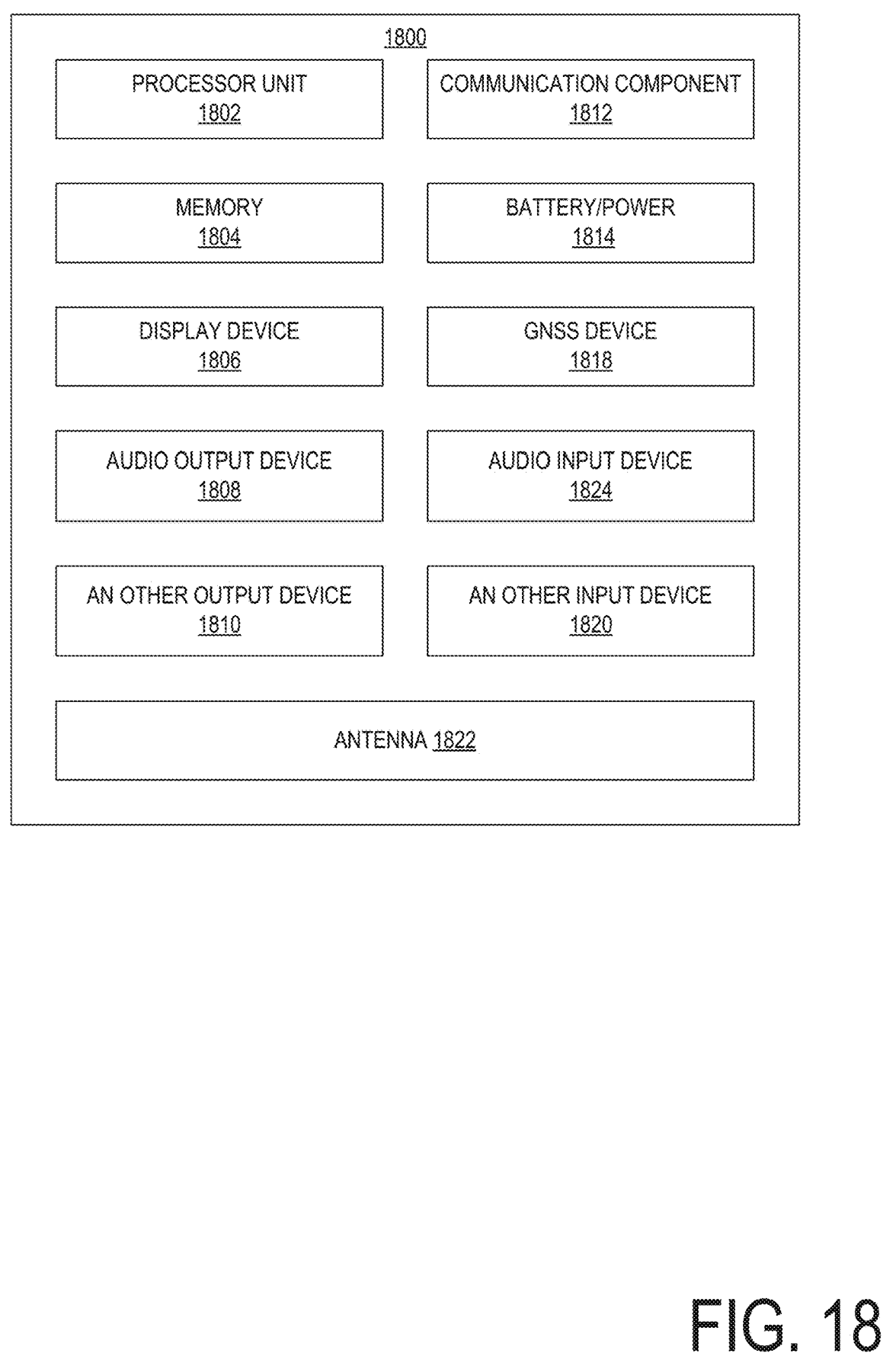

1800

| PROCESSOR UNIT 1802 | COMMUNICATION COMPONENT 1812 |

| MEMORY 1804 | BATTERY/POWER 1814 |

| DISPLAY DEVICE 1806 | GNSS DEVICE 1818 |

| AUDIO OUTPUT DEVICE 1808 | AUDIO INPUT DEVICE 1824 |

| AN OTHER OUTPUT DEVICE 1810 | AN OTHER INPUT DEVICE 1820 |

ANTENNA 1822

FIG. 18

CAVITY-LESS INTERCONNECT COMPONENT ON GLASS CORE

BACKGROUND

Die partitioning enables miniaturization of small form factor and high performance without some of the yield issues seen with other methods, but die partitioning requires fine die-to-die interconnections in a package. A variety of interconnect component architectures and approaches have been proposed and are being actively investigated.

BRIEF DESCRIPTION OF THE DRAWINGS

FIG. 18 is a block diagram of an example electrical device that may include any of the embodiments disclosed herein.

DETAILED DESCRIPTION

Figure 1:
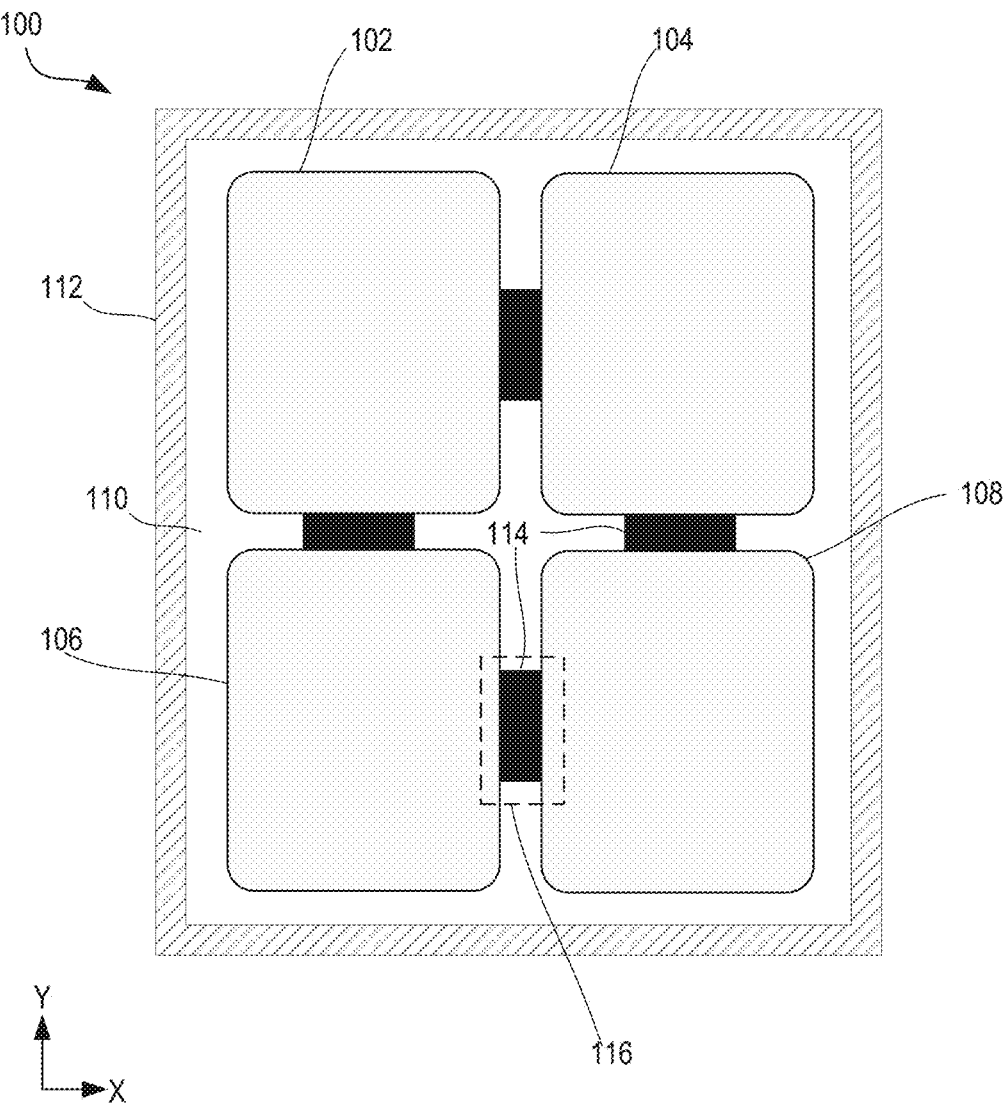
FIG. 1 illustrates an example multi-die assembly in which local interconnect components are implemented on glass, in accordance with various embodiments.

The demands for miniaturization of form factor and increased levels of integration for high performance are technical challenges driving sophisticated packaging approaches in the semiconductor industry. Die partitioning is a technical solution that enables miniaturization of small form factor and high performance without some of the yield issues seen with other methods, but die partitioning introduces a technical challenge for providing fine die-to-die interconnections and operational communication in a package.

The die-to-die interconnections and operational communication in a package can be facilitated with a component generally referred to herein as a local interconnect component. The local interconnect component can be implemented as a silicon interposer (interposer) or a local silicon interconnect (local interconnect). In some embodiments, the local interconnect component can be a silicon bridge. In some embodiments, the local interconnect component can be compliant with a Universal Chiplet Interconnect express (UCIe) standard.

A small silicon bridge component can be embedded in a package and support very high-density interconnects between heterogeneous die on a single package. Whereas a silicon interposer with TSVs (through-silicon vias) can be expensive, implementing the local interconnect component with a small silicon bridge component that is embedded in the package enables placement of very high density die-to-die connections only where needed. Standard flip-chip assembly can be used for robust power delivery to the package and to connect high-speed signals directly from chip to the package substrate. Accordingly, the silicon bridge enables a lower cost and simpler 2.5D packaging approach.

Future generations of die partitioning present additional technical challenges, in that, local interconnect components that can connect the dies at much finer bump pitches (25 microns or lower) than that are currently delivered by interconnect components are needed. Additionally, the silicon bridge approach can suffer from a high cumulative Bump Thickness Variation (BTV); therefore, as the number of bridge components to be embedded in a package increase, the cost of embedding and yields may suffer. Therefore, alternate architectures and/or approaches have been proposed and are being actively investigated.

A proposed technical solution involves inserting a silicon bridge component into a nested glass interposer. Generally, this requires creating a cavity in the glass interposer and then embedding the bridge component in the cavity. However, this approach is challenging as it requires precise cavity-drilling, cavity filling, and encapsulation; currently, it is difficult to achieve better than a +/–10% cavity depth variation. Additionally, the cavity may not be flat (laterally), introducing a tilt of the final position of the silicon bridge in the cavity. Accordingly, this approach may not meet the needs of decreasing the bump pitch on the bridge component. Thus, solutions that can accommodate high cavity depth variation and/or non-flat surface are desired.

Embodiments disclosed herein propose a technical solution to the above-described technical problems, in the form of a glass core with a cavity-less local interconnect component (can include a silicon component with through-silicon via (TSV) connections, a glass component with through-glass vias, or other), or an active functional die instead of a standard bridge die with no TSV connections. Provided embodiments attach the local interconnect component directly to a glass core, followed by a mold a grind step. The provided embodiments offer several technological and economic advantages, a first being additional mechanical flatness and capacity for fine pitch geometries and tiling supported by the glass core, in addition to the glass core providing improved flatness and mechanical stiffness during manufacture and assembly. These concepts are developed in more detail below.

Example embodiments will hereinafter be described in conjunction with the following drawing figures, wherein like numerals denote like elements. Figures are not necessarily to scale but may be relied on for spatial orientation and relative positioning of features. As may be appreciated, certain terminology, such as "ceiling" and "floor", as well as "upper, ", "uppermost", "lower," "above," "below," "bottom," and "top" refer to directions based on viewing the Figures to which reference is made. Further, terms such as "front," "back," "rear,", "side", "vertical", and "horizontal" may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the term "adjacent" refers to layers or components that are in direct physical contact with each other, with no layers or components in between them. For example, a layer X that is adjacent to a layer Y refers to a layer that is in direct physical contact with layer Y. In contrast, as used herein, the phrase(s) "located on" (in the alternative, "located under," "located above/over," or "located next to," in the context of a first layer or component located on a second layer or component) includes (i) configurations in which the first layer or component is directly physically attached to the second layer (i.e., adjacent), and (ii) component and configurations in which the first layer or component is attached (e.g. coupled) to the second layer or component via one or more intervening layers or components.

Terms modified by the word "substantially" include arrangements, orientations, spacings, or positions that vary slightly from the meaning of the unmodified term. For example, the portion of a first layer or feature that is substantially perpendicular to a second layer or feature can include a first layer or feature that is +/−20 degrees from a second layer or feature, a first surface that is substantially parallel to a second surface can include a first surface that is within several degrees of parallel from the second surface. The amount of variation covered by a term modified by the term "substantially" is indicated throughout for certain arrangements, orientations, spacing, positions, etc. Values modified by the word "about" include values with +/−10% of the described values and values listed as being within a range include those within a range from 10% less than the described lower range limit and 10% greater than the described higher range limit.

As used herein, the term "electronic component" can refer to an active electronic circuit (e.g., processing unit, memory, storage device, FET) or a passive electronic circuit (e.g., resistor, inductor, capacitor).

As used herein, the term "integrated circuit component" can refer to an electronic component configured on a semiconducting material to perform a function. An integrated circuit (IC) component can comprise one or more of any computing system components described or referenced herein or any other computing system component, such as a processor unit (e.g., system-on-a-chip (SoC), processor core, graphics processor unit (GPU), accelerator, chipset processor), I/O controller, memory, or network interface controller, and can comprise one or more additional active or passive devices such as capacitors, decoupling capacitors, resistors, inductors, fuses, diodes, transformers, sensors, electrostatic discharge (ESD) devices, and memory devices.

A non-limiting example of an unpackaged integrated circuit component includes a single monolithic integrated circuit die (shortened herein to "die"); the die may include solder bumps attached to contacts on the die. When present on the die, the solder bumps or other conductive contacts can enable the die to be directly attached to a printed circuit board (PCB) or other substrates.

A non-limiting example of a packaged integrated circuit component comprises one or more integrated circuit dies mounted on a package substrate with the integrated circuit dies and package substrate encapsulated in a casing material, such as a metal, plastic, glass, or ceramic. Often the casing includes an integrated heat spreader (IHS); the packaged integrated circuit component often has bumps, leads, or pins attached to the package substrate (either directly or by wires attaching the bumps, leads, or pins to the package substrate) for attaching the packaged integrated circuit component to a printed circuit board (or motherboard or base board) or another component.

Local interconnect components and interconnect structures are referred to herein. As used herein, local interconnect components refer to separately manufactured components that can be placed on a planar glass surface and between two die, to either couple or directly connect signals between the die. In contrast, "interconnect structures" can comprise one or more conductive traces, one or more vias, or a combination thereof. The term conductive trace includes lateral signal routing and via contacts, which may be vertically oriented.

The following detailed description is not intended to limit the application and use of the disclosed technologies. It may be evident that the novel embodiments can be practiced without every detail described herein. For the sake of brevity, well-known structures and devices may be shown in block diagram form to facilitate a description thereof.

In the non-limiting example in FIG. 1, a multi-die assembly 100 comprises four die (die 102, die 104, die 106, and die 108). In other multi-die assemblies, there may be more or less than four die, and the die may be arranged in any fashion (e.g., square (e.g., 2×2, 4×4, 6×6), rectangular (e.g., 2×4, 3×5, 4×7)). The die may be attached to a package substrate 112, which may comprise a printed circuit board, thin-film substrate, or another suitable substrate. In various embodiments, the die in the multi-die assembly 100 can be overmolded with an encapsulant 110. The encapsulant 110 can comprise molding compound, dielectric materials, metal, ceramic, plastic, or a combination thereof.

The die 102, 104, 106, and 108, may be unpackaged integrated circuit die, and may alternatively be referred to as chips, chiplets, chip complexes, or chiplet complexes. While the terms die, chip, and chiplet may be used interchangeably, the term chiplet is sometimes used to refer to an integrated circuit die that implements a subset of the functionality of a larger integrated circuit component. Although the illustration depicts the chiplets as having uniform dimensions, in practice, chiplet dimensions (lateral dimensions and thickness) and shape can vary among chiplets; moreover, the chiplets may vary by type/functionality (e.g., compute, memory, I/O, power management (controlling the delivery of power and/or providing power to components)). Any integrated circuit die, chip, or chiplet can implement any portion of the functionality of any processor unit described or referenced herein. Furthermore, a multi-die assembly 100 can have any shape, such as a substantially square shape, substantially rectangular shape or substantially circular shape.

The use of chiplets in integrated circuit components has become attractive as feature sizes have reduced and the demand for high-performance larger integrated circuit components has increased. The approach of assembling multiple known-good dies (chiplets) to form a larger integrated circuit component can result in improved manufacturing efficiencies, as the overall yield of an integrated circuit component assembled from multiple small chiplets is better than that of an integrated circuit component in which the functionality of the chiplets is implemented on a single large integrated circuit die.

In various embodiments, a thermal management solution (not shown) comprising a cooling component such as a vapor chamber, heat pipe, heat sink, or liquid-cooled cold plate may be attached to a multi-die assembly 100. As part of a thermal management solution, a thermal conduction layer interface material (TIM) may be located over the die 102, 104, 106, 108. The TIM can be any suitable material, such as a silver particle-filled thermal compound, thermal grease, phase change materials, indium foils, or graphite sheets. The thermal management solution can be a conformal solution that accommodates differences in heights of the integrated circuit dies for which the thermal management solution provides cooling. For example, a thermal management solution can comprise a substantially planar cooling component with TIMs of varying thickness between the cooling component and the integrated circuit dies. In another example, the cooling component is non-planar, and the profile of the cooling component can vary with the thickness of the integrated circuit dies for which the cooling component provides cooling. In such embodiments, the TIM can be of substantially uniform thickness between the cooling component and the integrated circuit dies of varying thicknesses. Thermal management solutions can also include an integrated heat spreader.

Various interconnect components 114 may be employed on the multi-die assembly 100. In particular, when the multi-die assembly 100 implements a large and/or complex integrated circuit component formed using one or more chiplets, the interconnect components 114 may comprise one or more interposers, interconnect bridges, local interconnect components, photonic integrated circuits (PICs), electrical integrated circuits, programmable gate arrays, memory components (e.g., high bandwidth memory (HBM)), and/or local silicon interconnects. Provided embodiments manufacture local interconnect components 114 separately from manufacture of die and attach the local interconnect component to a glass sheet or layer using an attachment means, as is described in more detail below. The separate manufacture of the local interconnect component 114 allows for the use of semiconductor manufacturing techniques to create the local interconnect component 114, thereby creating local interconnect components 114 with internal features (e.g., through-glass or through-silicon vias, pads, conductive traces) with geometries (e.g., via width/space, conductive trace width/space/thickness) that can be smaller than the geometries of similar features external to the local interconnect component in a substrate. In an example, the local interconnect component 114 can support finer bump pitches than a die pitch (e.g., pitches of 25 microns or less).

The local interconnect component 114 can be implemented in silicon (e.g., as a silicon interposer (interposer), a local silicon bridge), a dielectric substrate material such as an Ajinomoto Build-up Film (ABF), ceramics, glass, or the like. As is disclosed in more detail below, provided embodiments attach the local interconnect component 114 to a glass core using an attachment means.

Figure 2:
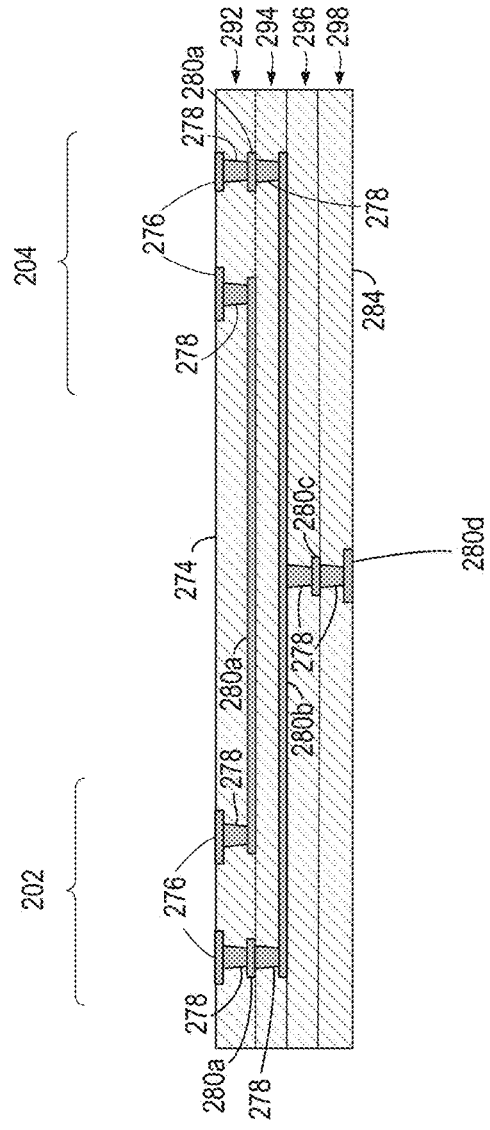
FIG. 2 is a simplified cross-sectional illustration of an example local interconnect component, in accordance with various embodiments.

The dashed line 116 narrows the focus to two neighboring die and an interconnect component, for reference in various figures that follow, and FIG. 2 illustrates a simplified cross-sectional illustration of a local interconnect component 200 in accordance with various embodiments herein.

The body of the local interconnect component 200 may comprise multiple dielectric layers and multiple conductive traces. Bridge conductive contacts 276 are located on a surface 274 of the local interconnect component 200. In various embodiments, the bridge conductive contacts 276 comprise copper. In the example shown in FIG. 2, local interconnect component 200 comprises conductive traces 280a, 280b, 280c, and 280d located in first, second, third, and fourth dielectric layers 292, 294, 296, and 298, respectively. The dielectric layers 292, 294, 296, and 298 further comprise vias 278 providing connections between conductive traces in different dielectric layers or between a conductive trace and a bridge conductive contact 276.

Bridge vias 278 and bridge conductive traces 280 may comprise through-silicon vias TSVs or other traces filled with copper or another suitable conductive material and provide electrically conductive paths between the bridge conductive contacts 276. The dielectric layers 292, 294, 296, and 298 can be a suitable nitride or oxide, such as silicon dioxide ($SiO_2$), carbon-doped silicon dioxide, fluorine-doped silicon dioxide, hydrogen-doped silicon dioxide, or silicon nitride.

Figure 5:
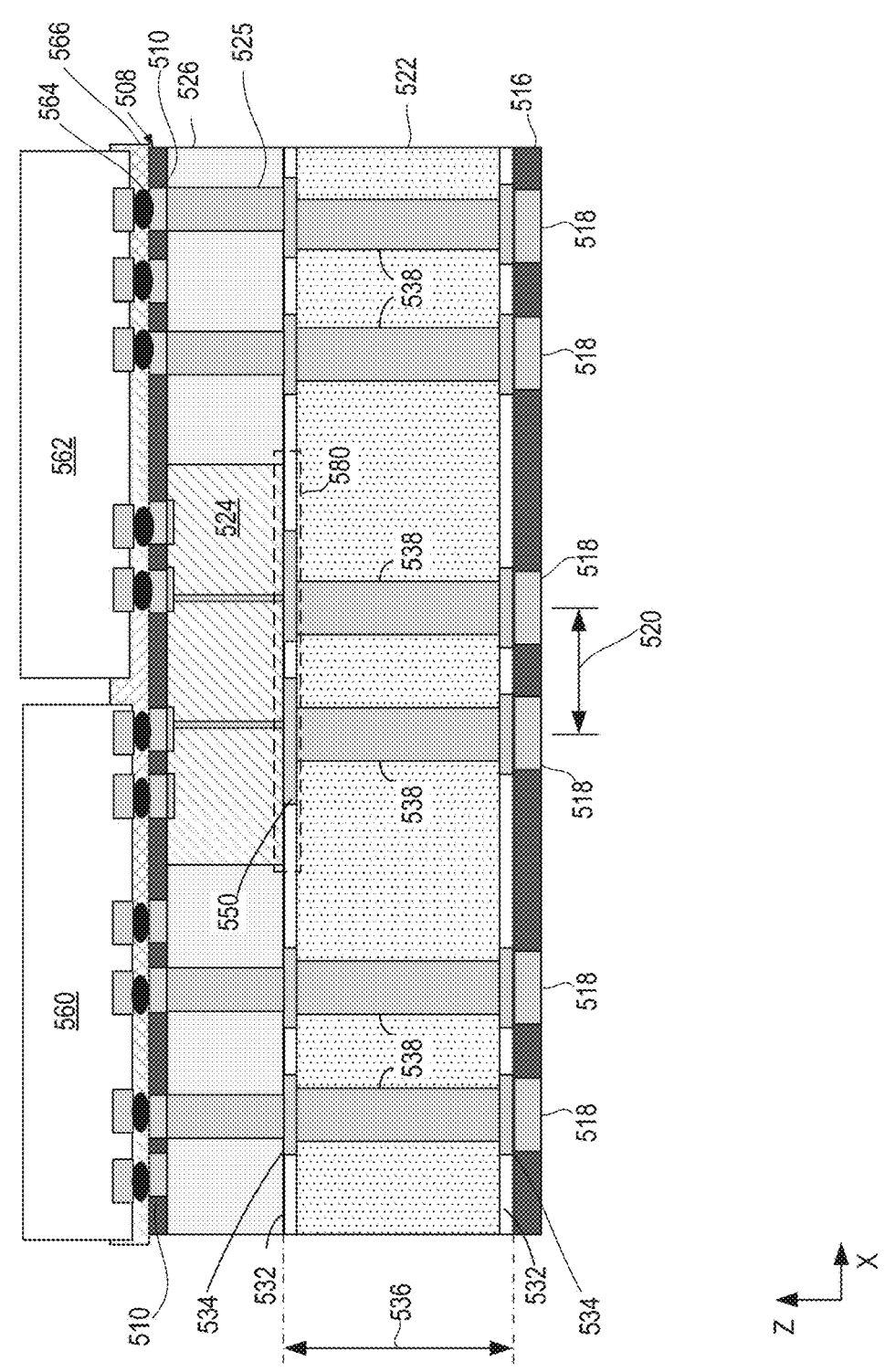

In some embodiments, the bridge conductive contacts 276 on the surface 274 of the local interconnect component 200 can have a die attached directly thereto, such as, with liquid metal or solder balls (see, e.g., FIG. 5). In other embodiments, one or more redistribution layers (RDLs) may be built up on top of the local interconnect component 200 (meaning, in the Z direction in the figure), including optionally providing an electrically conductive path between two die, prior to attaching the die (see, e.g., FIG. 7).

Together, conductive contacts and traces/vias 276, 278, 280a, and 280b, provide electrically conductive paths between patches for a first die at a location 202 and a second die at a location 204, and from a first die to a lower surface for connection with a through-glass via, and thus allow the two die to be communicatively coupled.

Figure 3:
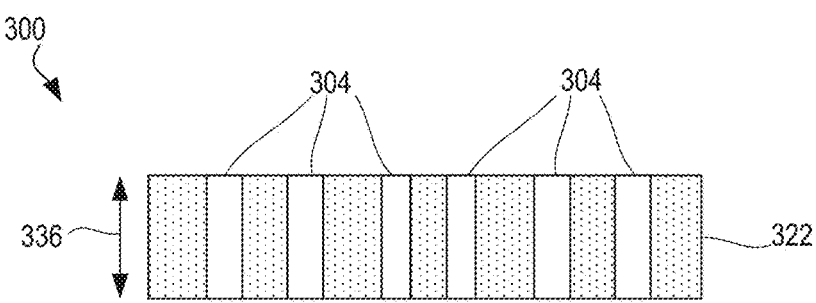
FIGS. 3-7 illustrate embodiments of a first attachment means for a local interconnect component on a glass core, at various stages of an example process flow.
Figure 3:
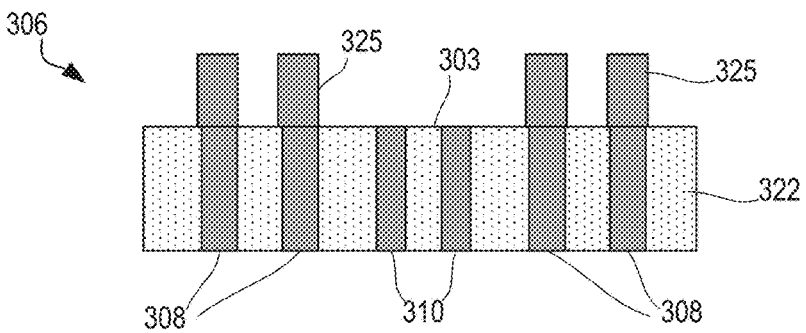
Figure 3:
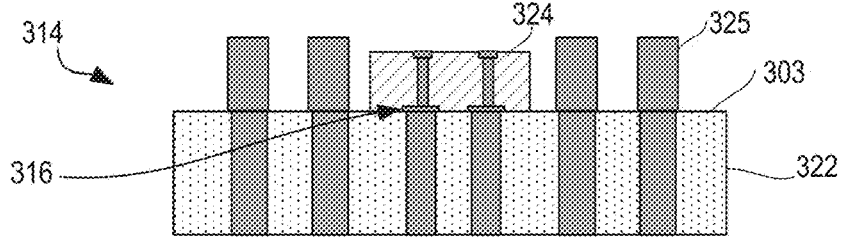
Figure 3:
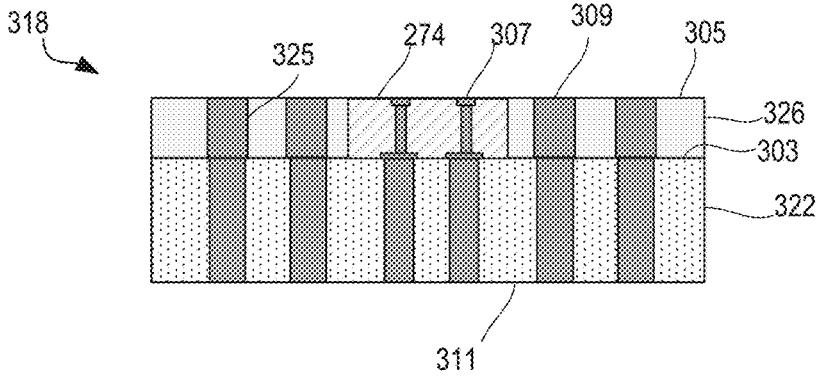

Provided embodiments attach the local interconnect component 200 to the planar upper surface of a glass layer or glass core, using an attachment means. Turning to FIG. 3, various stages of an example process flow for a first attachment means are illustrated. At 300, a glass core 322 is patterned with a plurality of through-glass vias (TGVs) 304. The TGVs 304 may have a diameter of about 25-150 microns and a pitch of about 50-300 microns. The glass core may have thickness 336 in a range of about 30 microns to 1.5 millimeters, +/-10%. The glass core 322 may comprise glass, (as used herein, glass can be an alkali-free alkaline earth boro-aluminosilicate glass, such as a glass comprising aluminum, oxygen, boron, silicon, and an alkaline-earth metal (e.g., beryllium, magnesium, calcium, strontium, barium, radium, such as a glass comprising $SiO_2$, $Al_2O_3$, $B_2O_3$, and MgO), or a photosensitive glass (photomachineable or photostructurable glass). In some embodiments, a photosensitive glass can be a glass that belongs to the lithium-silicate family of glass (e.g., a glass comprising lithium, silicon, and oxygen) comprising metallic particles, such as gold, silver, or other suitable metallic particles. Glass core 322 may comprise multiple glass sheets bonded together with an adhesion layer.

At 306, the TGVs are filled with an electrically conductive material, such as, a metal (e.g., copper, aluminum, nickel, cobalt, iron, tin, gold, silver, or combinations thereof). TGVs 308, 310 are filled in this embodiment, and conductive pillars 325 are plated on an upper surface 303 of the glass core 322.

At 314, a local interconnect component 324 is attached to the glass core 322 using an attachment means. In embodiment 314 the attachment means is hybrid bonding (the bonding of components through direct attachment 316 of filled TGVs 310 and conductive contacts in dielectric layers of the components) to the upper surface 303 of the glass core 322. Hybrid bonding can include dielectric to dielectric and interconnect to interconnect bonding. At 318, the upper surface 303 is molded with mold 326 of substantial thickness to cover the local interconnect component 324, and then the upper surface 305 is planarized to reveal the bridge contacts 307 and upper surface 309 of the copper pillars 325 on the local interconnect component 324 (see, e.g., FIG. 2, 274, 276). In some embodiments, after planarization, the local interconnect component 324 is surrounded by mold (i.e., surrounded laterally, in the figure, but not completely enclosed) and the upper surface 274 of the local interconnect component 374 does not have mold on it. Depending on the application, the structure at 318 may be directly implemented in a multi-die assembly or may have further dielectric layers or redistribution layers (RDL) added before implementing it in a multi-die assembly.

Figure 4:
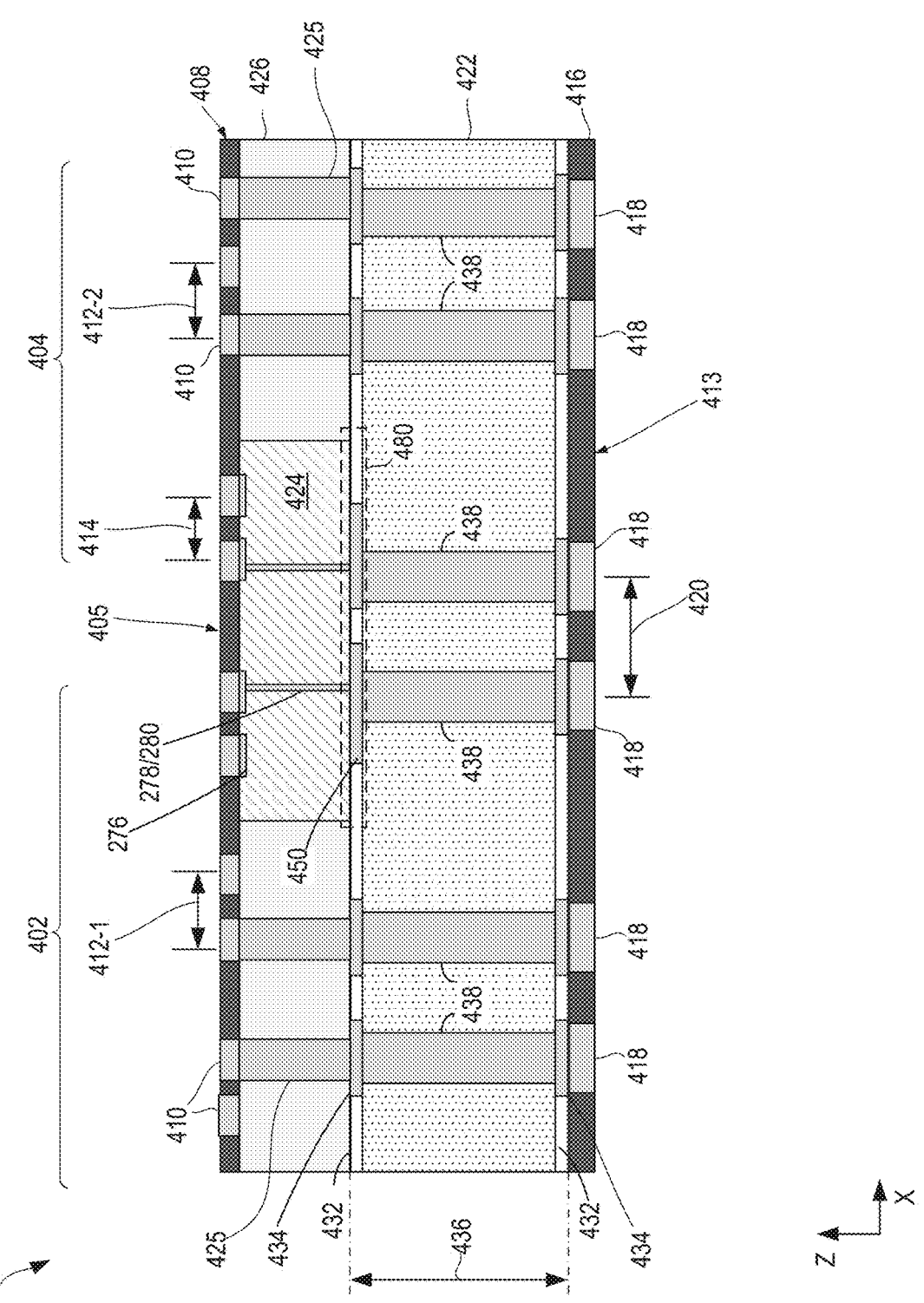

Moving to embodiment 400 in FIG. 4, the glass core 422 has the filled through-glass vias (TGVs) 438 developed in FIG. 3. In some embodiments, there may be an optional encapsulation layer 432 on the upper and lower surface of the glass core 422, and the optional encapsulation layer 432 can have conductive contacts 434 aligned with the filled TGVs 438, as indicated. The planarized molding layer 426 is shown surrounding (laterally) the local interconnect component 424 and the plated copper pillars 425. The local interconnect component 424 is attached to the glass core 422 using an attachment means 480; in the embodiment 400, the attachment means 480 comprises the hybrid bonding 450 described in connection with FIG. 3.

As shown in FIG. 4, a solder resist or other dielectric material 408 may be added on the upper surface 305 of embodiment 318 (FIG. 3) and may have a plurality of conductive contacts patterned therein, the plurality of contacts being arranged into separate pinouts, for example, as a first pinout for a first die (e.g., at location 402) and a second pinout for a second die (e.g., at location 404). Additionally, a solder resist or other dielectric material 416 may be added on the lower surface 311 of embodiment 318 and may have a plurality of substrate package conductive contacts 418 patterned therein, the plurality of substrate/package conductive contacts 418 being arranged into a pinout suitable for a mid-level substrate package. As used herein, a pinout is a physical arrangement of conductive contacts at a respective pitch.

As used herein, "pitch" means the physical distance at which a feature is repeated (e.g., the space from the center of one instance of a feature to the center of an adjacent instance of the feature). As used herein "fine pitch" generally means a die-scale pitch (e.g., on upper surface 405, pitch 412-1 and pitch 412-2 separate conductive contacts 410 and may each be a fine pitch, and pitch 412-1 and pitch 412-2 may be the same or different from each other). Fine pitch dimensions may include a range of about 0.001 mm to about 0.3 mm. In some embodiments, features having a fine pitch have dimensions of about 1 μm (micron) or less. In other embodiments, features having a fine pitch may have dimensions of about 0.5 μm or less. In addition to the conductive contacts that are used to attach integrated circuit dies to a panel, other features that can have a fine pitch include the vias in one or more RDLs adjacent to the pinouts for integrated circuit dies. A bridge pitch 414 (measured between bridge conductive contacts FIG. 2, 276) on the local interconnect component 424, may be smaller than a die pitch.

In contrast, "coarse pitch" generally means a package-level pitch, which is larger than a fine pitch. For example, pitch 420 may be a coarse pitch. The coarse pitch geometries may be for a ball grid array (BGA) or a land grid array (LGA). In various embodiments, a BGA pitch is in a range of about 0.1 mm to about 1 mm, and LGA pitch is in a range of about 0.1 mm to about 1 mm. Conductive contacts 410 and conductive contacts 418 can comprise solder, copper, or another suitable metal or other material.

Figure 6:
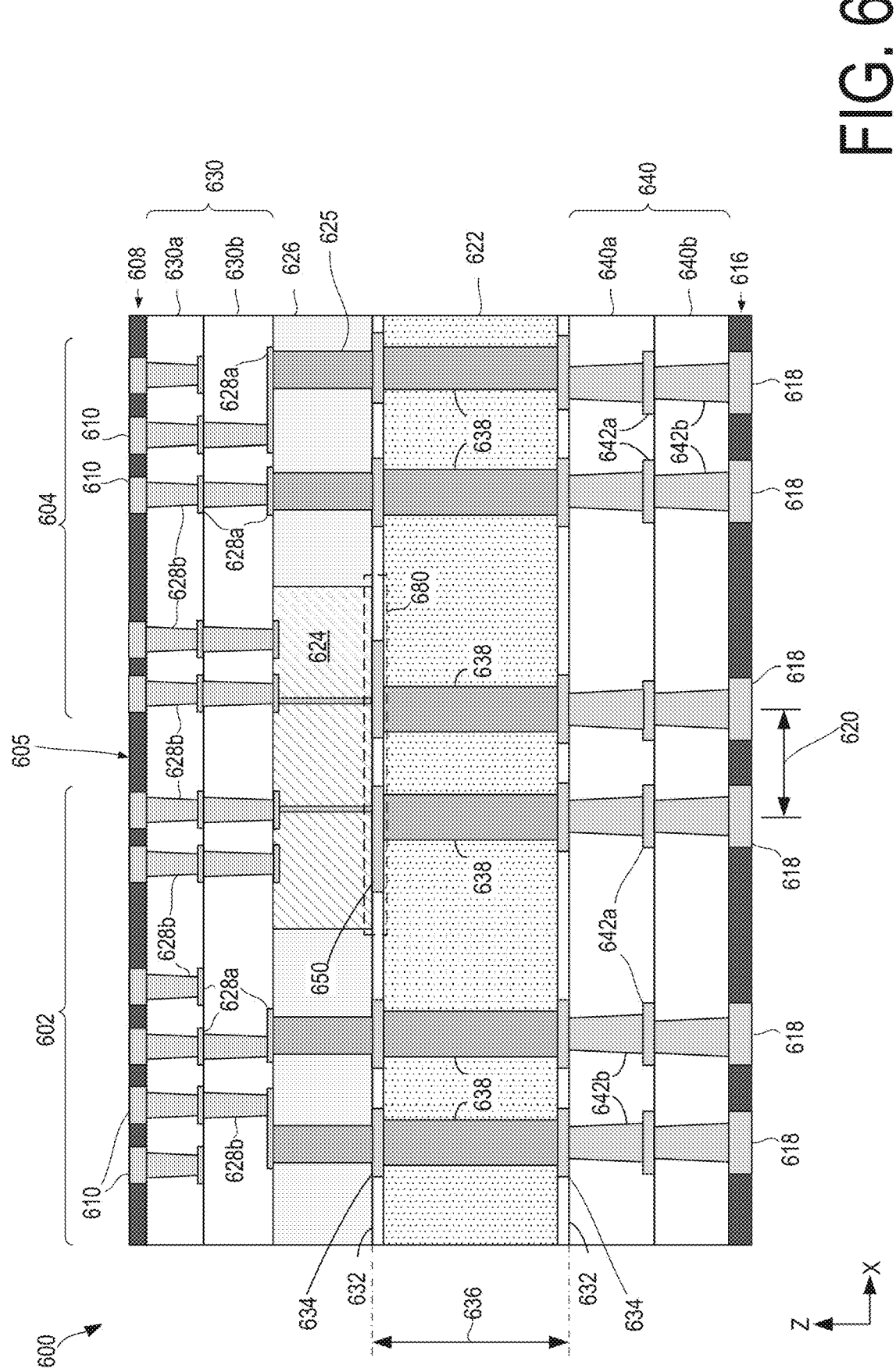
Figure 7:
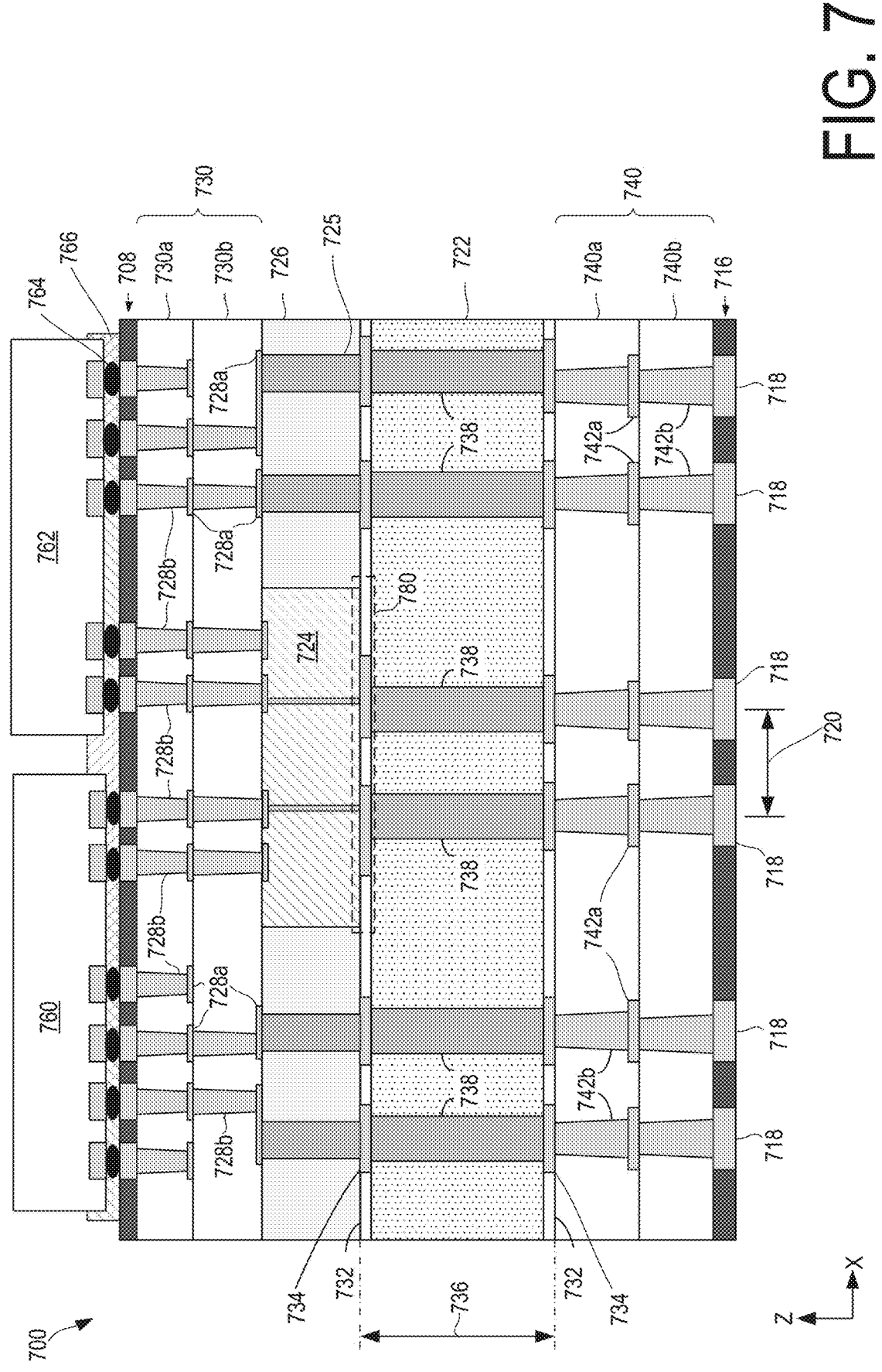

FIGS. 5-7 develop additional embodiments and build upon concepts described above. Accordingly, many of the components from FIGS. 2-4 are reproduced in FIGS. 5-7, as is observable with a comparison of shapes, locations, and context. For example, glass core 322, 422, 522, 622, and 722 are analogous; TGVs 438, 538, 638, and 738 are analogous; conductive contacts 410, 510, and 610 are analogous; conductive contacts 418, 518, 618, and 718 are analogous; local interconnect component 324, 424, 524, 624, and 724 are analogous; conductive pillars 325, 425, 525, 625, and 725 are analogous; solder resist or other dielectric material 408, 508, 608, and 708 are analogous (as well as solder resist or dielectric material 416, 516, 616, and 716); attachment means 480, 580, 680, and 780 are analogous; hybrid bonding 450 550, and 650 are analogous.

In embodiment 500 of FIG. 5, die 560 and die 562 are attached to the upper surface of the embodiment 400 at conductive contacts 510. Some signal routing may occur from at least one conductive contact of the first set of conductive contacts 510 (e.g., location 502) to at least one conductive contact of the second set of conductive contacts 510 (e.g., location 504), via the local interconnect component 534. Die 560 and die 562 have been attached via solder balls 564 and underfill 566. Die 560 and die 562 can be attached via conductive die bumps 564 (and FIG. 7, 764) or any solder. In some embodiments, a polymer can be used to bond copper conductive contacts (e.g., pads) on the die to copper conductive contacts (e.g., 510). In some embodiments, a polymer can also be used to bond solder conductive contacts on the die to solder conductive contacts on an embodiment 400 (or FIG. 6, embodiment 600). In some embodiments, an inorganic material (e.g., silicon dioxide, silicon nitride) can be used to bond copper conductive contacts of components together. In some embodiments, dies are attached to the upper surface 405 through direct attachment of bumps (e.g., microbumps) attached to both surfaces (e.g., die surface, panel surface).

In embodiment 600 of FIG. 6, additional redistribution layers 630 (630a and 630b) are added between upper surface 305 and the final solder resist layer 608 of the embodiment 318 and additional redistribution layers 640 (640a and 640b) added between lower surface 311 and final solder resist layer 616 of the embodiment 318. Although two RDL 630 sub-layers and two RDL 640 sub-layers are illustrated, in practice, there can be any number of RDL sub-layers. For example, in server applications, an RDL can comprise up to 10 sub-layers. In various embodiments, an RDL comprises a dielectric material and may include a suitable nitride or oxide, such as silicon dioxide ($SiO_2$), carbon-doped silicon dioxide (C-doped $SiO_2$, also known as CDO or organosilicate glass, which is a material that comprises silicon, oxygen, and carbon), fluorine-doped silicon dioxide (F-doped $SiO_2$, also known as fluorosilicate glass, which is a material that comprises fluorine, silicon, and oxygen), hydrogen-doped silicon dioxide (H-doped $SiO_2$, which is a material that comprises silicon, oxygen, and hydrogen). In some embodiments, an RDL comprises a photo-imageable dielectric (PID). In some embodiments, an RDL comprises an Ajinomoto Build-Up film (often referred to as ABF), which is a material that comprises an organic resin matrix with different types of fillers (for example, silica fillers of different sizes, or hollow fillers of different sizes) to control the coefficient of thermal expansion (CTE) and/or electrical properties of the RDLs (e.g., the dielectric constant (Dk), and/or dissipation factor (insertion loss) (Df)).

In some embodiments, it is advantageous for the RDLs 630 to have a CTE that matches that of integrated circuit dies (e.g., match the CTE of silicon) attached to a panel substrate. In some embodiments, the dielectric material of an RDL can have a CTE that is close (e.g., within 10%) to that of silicon. In other embodiments, the dielectric material of an RDL can be any type of epoxy molding compound. RDLs or build-up layers may include a metal layer comprising conductive traces (or metal lines), metals used for interconnect metals in the RDL include copper or other suitable metal.

For illustrative purposes, the RDL 630 comprises interconnect structures 628 and the RDL 640 comprises interconnect structures 642. The interconnect structures 628 and 642 may be arranged within the respective RDL to route electrical signals according to a wide variety of applications; in particular, the arrangement is not limited to the configuration of interconnect structures 628 depicted in FIG. 6. In some embodiments, the interconnect structures 628 may include conductive traces or metal lines (lines) and/or via contacts 628a and vias 628b. The conductive traces, via contacts, and vias can comprise an electrically conductive material such as a metal (e.g., copper, aluminum, nickel, cobalt, iron, tin, gold, silver, or combinations thereof). The lines of interconnect structures 628a may be arranged to route electrical signals along the surface of a plane that is substantially parallel with the surface 605. For example, the lines of interconnect structure 628a may route electrical signals in a direction in and out of the page and/or in a direction across the page. The vias 628b may be arranged to route electrical signals in a direction of a plane that is substantially perpendicular to the surface 605. Some of the vias 628b can be arranged with a fine pitch to match the pitch of the bridge conductive contacts (FIG. 2, 276).

Likewise, the interconnect structures 640 may include conductive traces or lines and/or via contacts 642a and or vias 642b comprising an electrically conductive material such as a metal (e.g., copper, aluminum, nickel, cobalt, iron, tin, gold, silver, or combinations thereof). The lines of interconnect structures 642a may be arranged to route electrical signals in a direction that is substantially parallel with the surface 6051. For example, the lines 642a may route electrical signals in a direction in and out of the page and/or in a direction across the page. The vias 642b may be arranged to route electrical signals in a direction of a plane that is substantially perpendicular to the surface 605.

The RDLs 630 in combination with RDLs 640 can be considered to translate the fine pitch of the die contacts 610 to the coarse pitch of the package/substrate conductive contacts 618. Persons with skill in the art may appreciate that the distinctions in the various dielectric or build-up layers attributed to RDL 630 and RDL 640 have been introduced for illustrative purposes; in a cross-sectional image of the embodiment 600, such as by a transmission electron microscope (TEM), the layers 608, 630, 640, and 616 may be indistinguishable.

With reference to FIG. 7, interconnect structures 628 and 728 are analogous, and interconnect structures 642 and 742 are analogous; build-up layers (or, alternatively, redistribution layers (RDL) or dielectric layers) 630 and 730 are analogous; build-up, dielectric or redistribution layers 640 and 740 are analogous; Further, persons with skill in the art will appreciate that, although some object numbers are omitted in some figures to simplify clutter, objects sharing a same shape, location, and/or context with labeled objects in other figures are analogous (e.g., comprise a same material, have a same dimension, possess a same property).

In embodiment 700 of FIG. 7, die 760 and die 762 are attached to the upper surface of the embodiment 600 at conductive contacts 610. Some signal routing may occur from at least one conductive contact of the first set of conductive contacts 610 (e.g., location 602) to at least one conductive contact of the second set of conductive contacts 610 (e.g., location 604), via the local interconnect component 634. Die 760 and die 762 can be attached via conductive die bumps 764 and underfill 766 or any other means as described in connection with FIG. 5.

Figure 8:
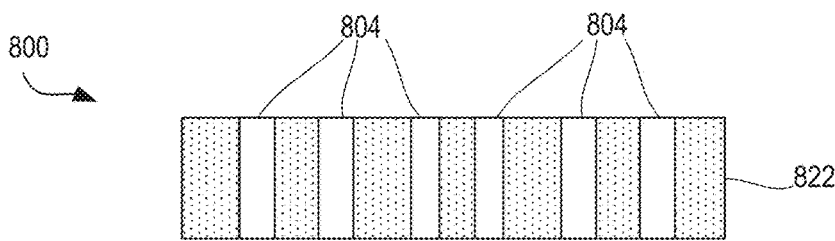
FIGS. 8-10 illustrate embodiments of a second attachment means for a local interconnect component on a glass core, at various stages of an example process flow.
Figure 8:
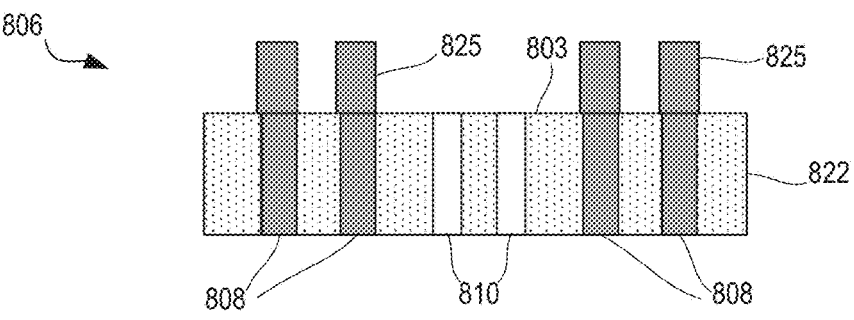
Figure 8:
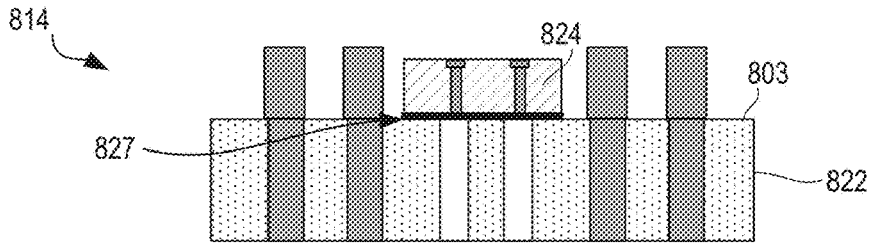
Figure 8:
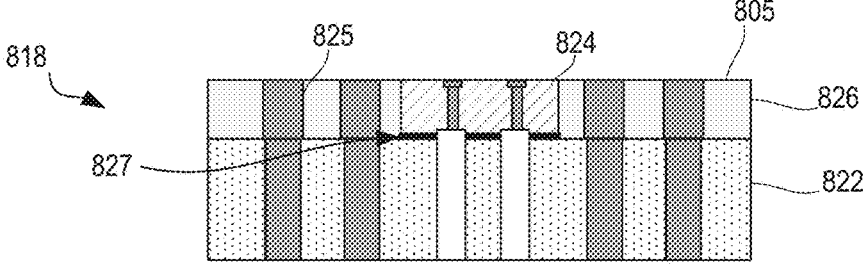
Figure 8:
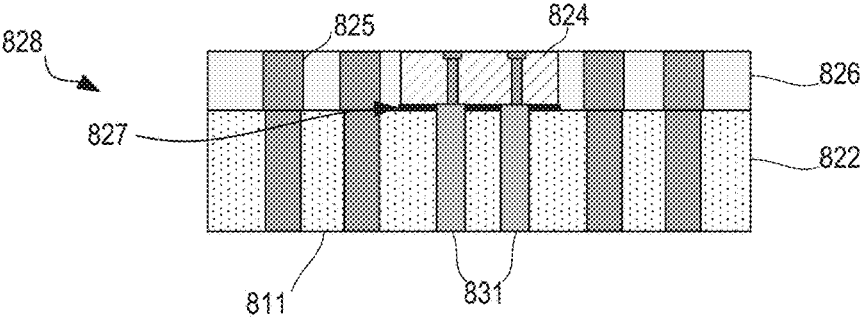
Figure 9:
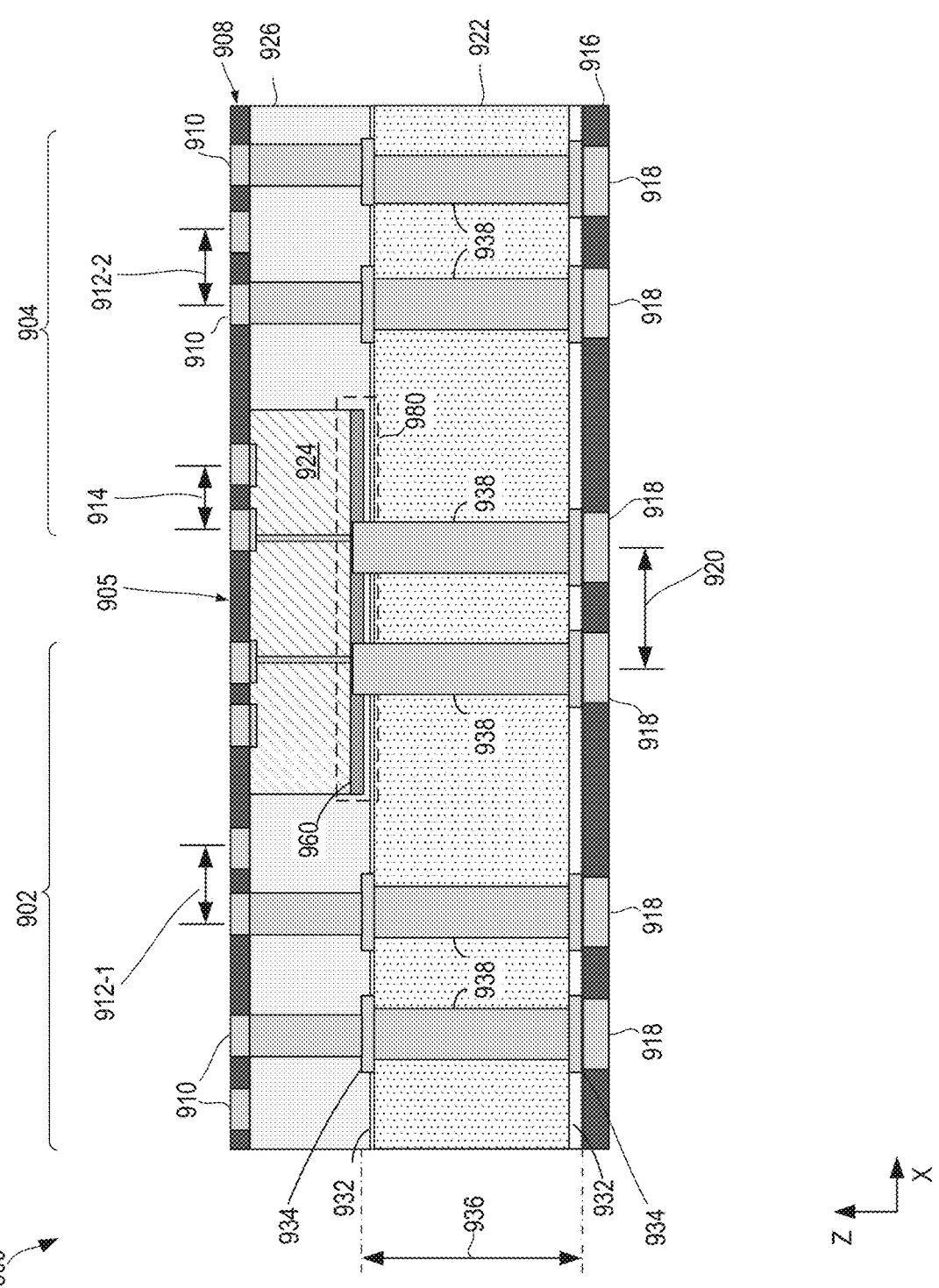
Figure 10:
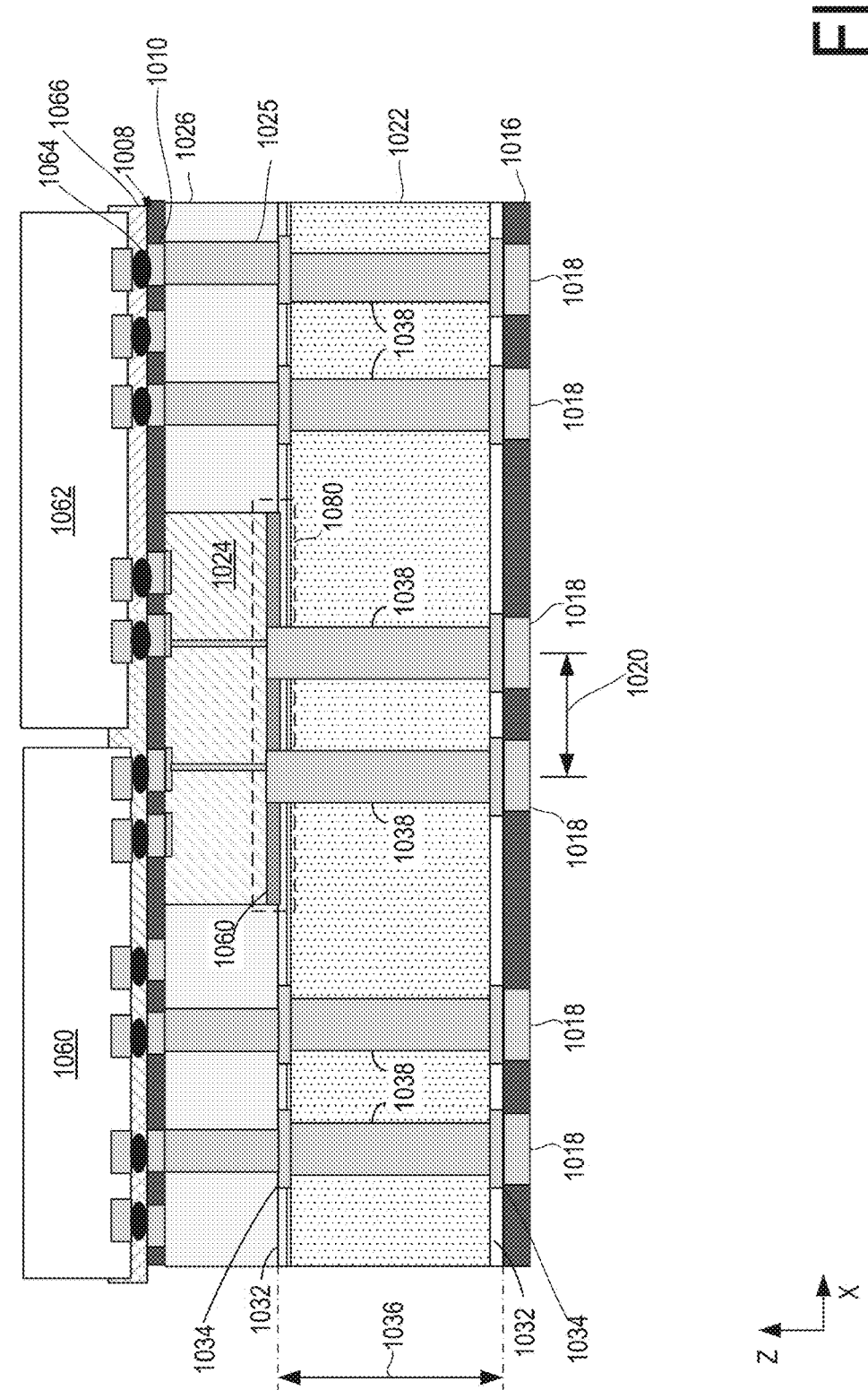

Moving to FIGS. 8-10, another attachment means for attaching the local interconnect component to the glass core is described. Embodiment 800 is analogous to embodiment 300, a glass core 822 has TGVs 304 patterned into it. At 806, respective TGVs are filled with an electrically conductive material, such as, a metal (e.g., copper, aluminum, nickel, cobalt, iron, tin, gold, silver, or combinations thereof). For this embodiment, only TGVs 808 are filled, and conductive pillars 825 are plated on an upper surface 803 of the glass core 822. The TGVs 810 are left open for a later process.

At 814, a local interconnect component 824 is attached to the glass core 822 using an attachment means (FIG. 9, 980). In embodiment 814 the attachment means is a self-align dry etch, in which a bond film 827 is applied, or located in between the upper surface 803 and the local interconnect component 824. The bond film may be an epoxy, a dielectric, or metallic.

At 818, the upper surface 803 is molded with mold 826 of substantial thickness to cover the local interconnect component 824, and then the upper surface 805 is planarized to reveal the bridge contacts 807 and upper surface 809 of the copper pillars 825 on the local interconnect component 824 (see, e.g., FIG. 2, 274, 276).

At 828, the open TGVs 810 are filled from the underside or lower surface 811, with a conductive material, becoming filled TGVs 831. Depending on the application, the structure at 828 may be directly implemented in a multi-die assembly or may have further dielectric layers or redistribution layers (RDL) added before implementing it in a multi-die assembly.

Moving to embodiment 900 in FIG. 9, the glass core 922 has the filled through-glass vias (TGVs) 938 developed in FIG. 3. In some embodiments, there may be an optional encapsulation layer 932 on the upper and lower surface of the glass core 922, and the optional encapsulation layer 932 can have conductive contacts 934 aligned with the filled TGVs 938, as indicated. The planarized molding layer 926 is shown over the local interconnect component 924 and the plated copper pillars 925. The local interconnect component 924 is attached to the glass core 922 using an attachment means 980; in the embodiment 900, the attachment means 980 comprises the above-described bond film 960 (FIG. 8, 827) and TGVs filled from the lower surface 811.

FIG. 9, like FIG. 4, illustrates that a solder resist or other dielectric material 908 may be added on the upper surface 805 of embodiment 828 (FIG. 8) and may have a plurality of conductive contacts patterned therein, the plurality of contacts being arranged into separate pinouts, for example, as a first pinout for a first die (e.g., at location 902) and a second pinout for a second die (e.g., at location 904). Additionally, a solder resist or other dielectric material 916 may be added on the lower surface 811 of embodiment 828 and may have a plurality of substrate package conductive contacts 918 patterned therein, the plurality of package conductive contacts 918 being arranged into a pinout suitable for a mid-level substrate package.

In embodiment 1000 of FIG. 10, die 1060 and die 1062 are attached to the upper surface of the embodiment 900 at conductive contacts 1010. Some signal routing may occur from at least one conductive contact of the first set of conductive contacts 1010 (e.g., location 1002) to at least one conductive contact of the second set of conductive contacts 1010 (e.g., location 1004), via the local interconnect component 1034. Die 1060 and die 1062 have been attached via solder balls 1064 and underfill 1066. Die 1060 and die 1062 can be attached via conductive die bumps 1064 or any solder. In some embodiments, a polymer can be used to bond copper conductive contacts (e.g., pads) on the die to copper conductive contacts (e.g., 1010). In some embodiments, a polymer can also be used to bond solder conductive contacts on the die to solder conductive contacts on an embodiment 900. In some embodiments, an inorganic material (e.g., silicon dioxide, silicon nitride) can be used to bond copper conductive contacts of components together. In some embodiments, dies are attached to the upper surface 905 through direct attachment of bumps (e.g., microbumps) attached to both surfaces (e.g., die surface, panel surface).

Figure 11:
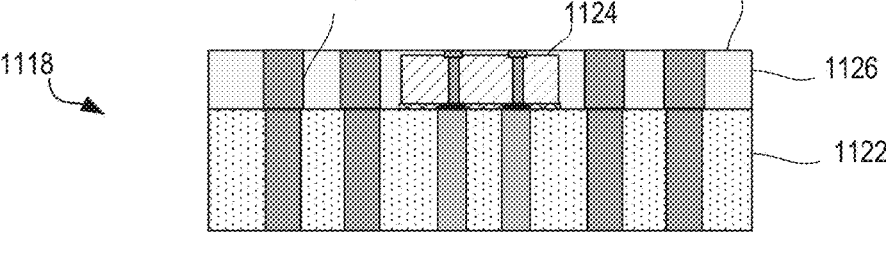
FIGS. 11-13 illustrate embodiments of a third attachment means for a local interconnect component on a glass core, at various stages of an example process flow.
Figure 12:
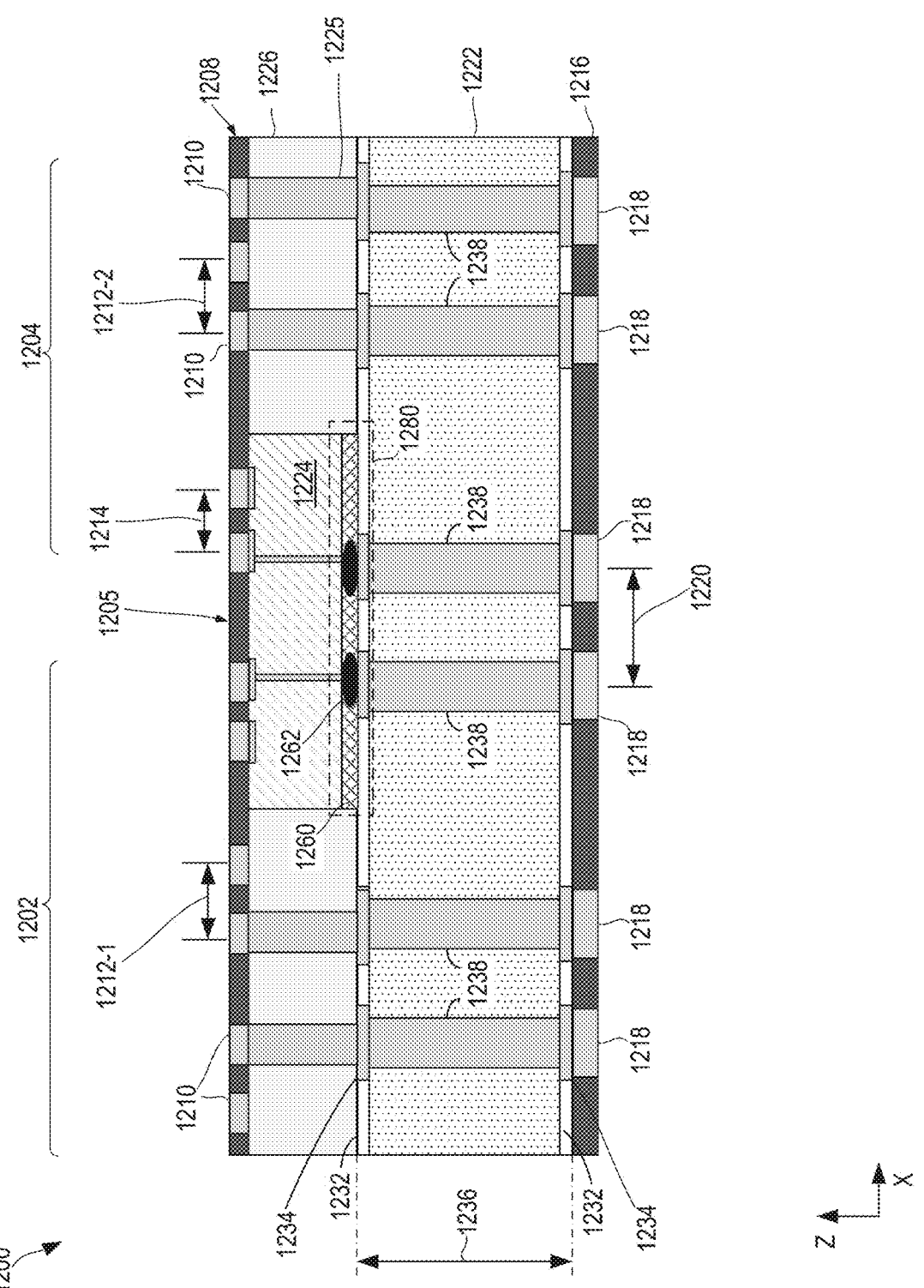
Figure 13:
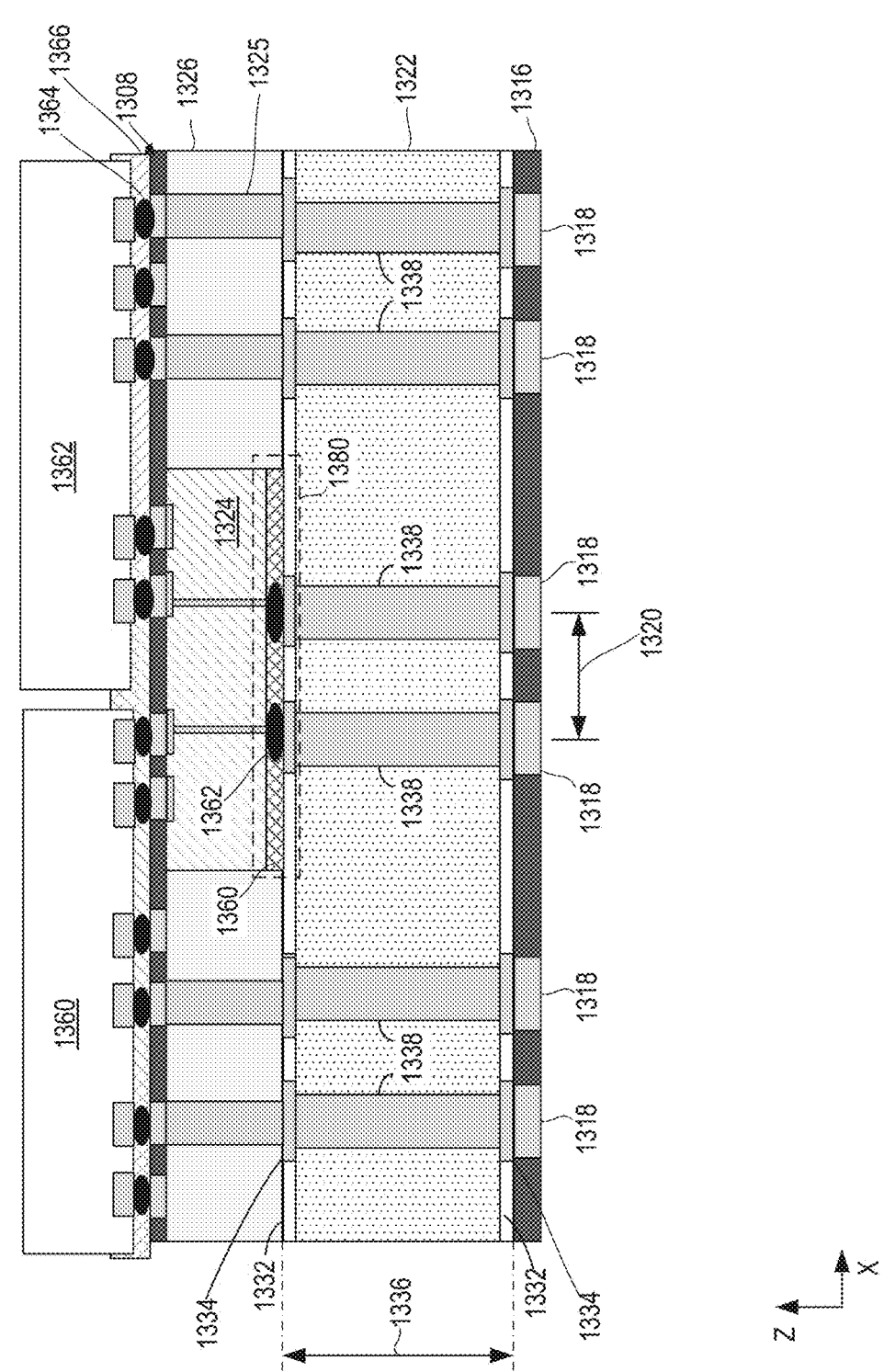

Moving to FIGS. 11-13, another attachment means for attaching the local interconnect component to the glass core is described. Embodiment 1100 is analogous to embodiment 300, a glass core 1122 has TGVs 304 patterned into it. At 1106, respective TGVs are filled with an electrically conductive material, such as, a metal (e.g., copper, aluminum, nickel, cobalt, iron, tin, gold, silver, or combinations thereof). For this embodiment, all of the TGVs 1108 are filled, and conductive pillars 1125 are plated on an upper surface 1103 of the glass core 1122.

At 1114, a local interconnect component 1124 is attached to the glass core 1122 using an attachment means (FIG. 12, 1280). In embodiment 1114, the attachment means is a solder attach and underfill process, with the solder 1129 and underfill 1127 being located in between the upper surface 1103 and the local interconnect component 1124.

At 1118, the upper surface 1103 is molded with mold 1126 of substantial thickness to cover the local interconnect component 1124, and then the upper surface 1105 is planarized to reveal the bridge contacts 1107 and upper surface 1109 of the copper pillars 1125 on the local interconnect component 1124 (see, e.g., FIG. 2, 274, 276). Depending on the application, the structure at 1118 may be directly implemented in a multi-die assembly or may have further dielectric layers or redistribution layers (RDL) added before implementing it in a multi-die assembly.

Moving to embodiment 1200 in FIG. 12, the glass core 1222 has the filled through-glass vias (TGVs) 1238 developed in FIG. 3. In some embodiments, there may be an optional encapsulation layer 1232 on the upper and lower surface of the glass core 1222, and the optional encapsulation layer 1232 can have conductive contacts 1234 aligned with the filled TGVs 1238, as indicated. The planarized molding layer 1226 is shown over the local interconnect component 1224 and the plated copper pillars 1225. The local interconnect component 1224 is attached to the glass core 1222 using an attachment means 1280; in the embodiment 1200, the attachment means 1280 comprises the above-described solder attach and underfill method.

FIG. 12, like FIGS. 4 and 9, illustrates that a solder resist or other dielectric material 1208 may be added on the upper surface 1105 of embodiment 1128 (FIG. 11) and may have a plurality of conductive contacts patterned therein, a plurality of contacts being arranged into separate pinouts, for example, as a first pinout for a first die (e.g., at location 1202) and a second pinout for a second die (e.g., at location

1204). Additionally, a solder resist or other dielectric material 1216 may be added on the lower surface 1111 of embodiment 1128 and may have a plurality of substrate package conductive contacts 1218 patterned therein, the plurality of package conductive contacts 1218 being arranged into a pinout suitable for a mid-level substrate package.

In embodiment 1300 of FIG. 13, die 1360 and die 1362 are attached to the upper surface of the embodiment 1200 at conductive contacts 1310. Some signal routing may occur from at least one conductive contact of the first set of conductive contacts 1310 (e.g., location 1302) to at least one conductive contact of the second set of conductive contacts 1310 (e.g., location 1304), via the local interconnect component 1334. Die 1360 and die 1362 have been attached via solder balls 1364 and underfill 1366. Die 1360 and die 1362 can be attached via conductive die bumps 1364 or any solder. In some embodiments, a polymer can be used to bond copper conductive contacts (e.g., pads) on the die to copper conductive contacts (e.g., 1310). In some embodiments, a polymer can also be used to bond solder conductive contacts on the die to solder conductive contacts on an embodiment 1200. In some embodiments, an inorganic material (e.g., silicon dioxide, silicon nitride) can be used to bond copper conductive contacts of components together. In some embodiments, dies are attached to the upper surface 1205 through direct attachment of bumps (e.g., microbumps) attached to both surfaces (e.g., die surface, panel surface).

As may be appreciated, the embodiments 828 and 1118 may also have RDL added on upper surfaces or lower surfaces of the apparatus, as described in connection with FIGS. 6-7, prior to having die attached. There can be an asymmetrical number of RDL layers on the upper and lower surfaces of the apparatus.

Figure 14:
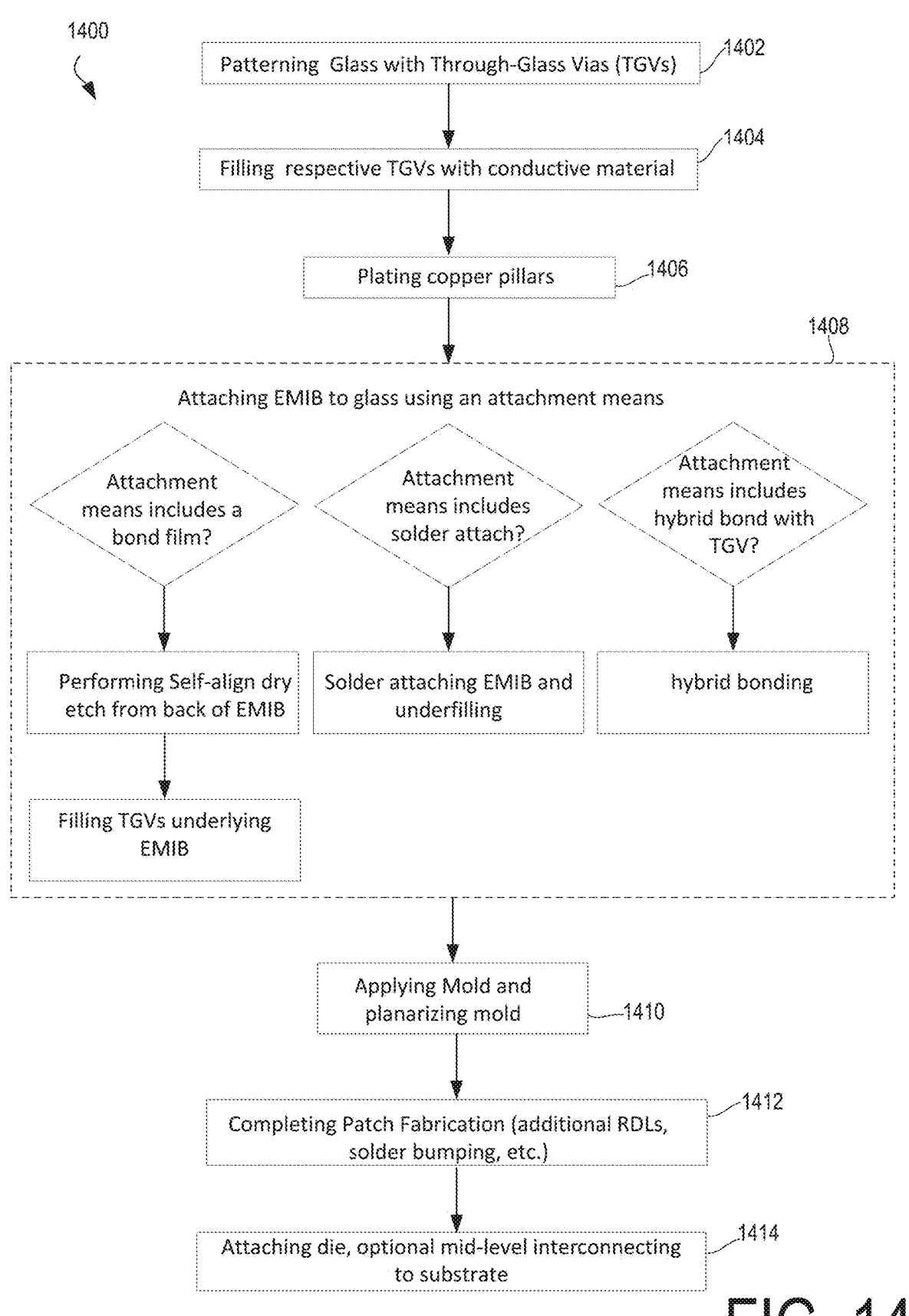
FIG. 14 illustrates example process steps for a method for manufacturing a local interconnect component on a glass core, in accordance with various embodiments.

FIG. 14 illustrates example process steps for a method for manufacturing a cavity-less local interconnect component on a glass core, in accordance with various embodiments. At 1402, a glass layer or glass core that is planar is patterned with TGVs. At 1404, respective TGVs are filled with conductive material; reference FIGS. 3, 8, and 11 for discussion regarding filling TGVs per attachment means. At 1406, copper pillars are plated onto the glass core, attached at filled TGVs. At 1408, a local interconnect component is attached to the glass core in accordance with one of the attachment means described in connection with FIGS. 3, 8, and 11. At 1410, mold is overlaid on the local interconnect component and pillars, and the upper surface is planarized to reveal respective contacts. At 1412, patch fabrication is completed; in various embodiments, this may mean adding RDL above and/or below the structure built at 1410. At 1412, solder bumps may be attached at upper and lower surfaces of the structure. At 1414, die may be attached at the upper surface of the structure and the structure may further be attached to a package substrate.

Thus, various non-limiting embodiments of a cavity-less local interconnect component on a glass core have been described. The disclosed embodiments leverage a glass core, which has a very low total thickness variation. Accordingly, embodiments have improved dimensional stability, lower relative bump thickness variation (rBTV). Additionally, by omitting the requirement for a cavity, embodiments provide a reduced true position error, which translates to reduced CTE mismatch. The following description provides additional detail and context for the die and various package assembly and device configurations that can be created based on or using the provided cavity-less local interconnect component on a glass core.

Figure 15:
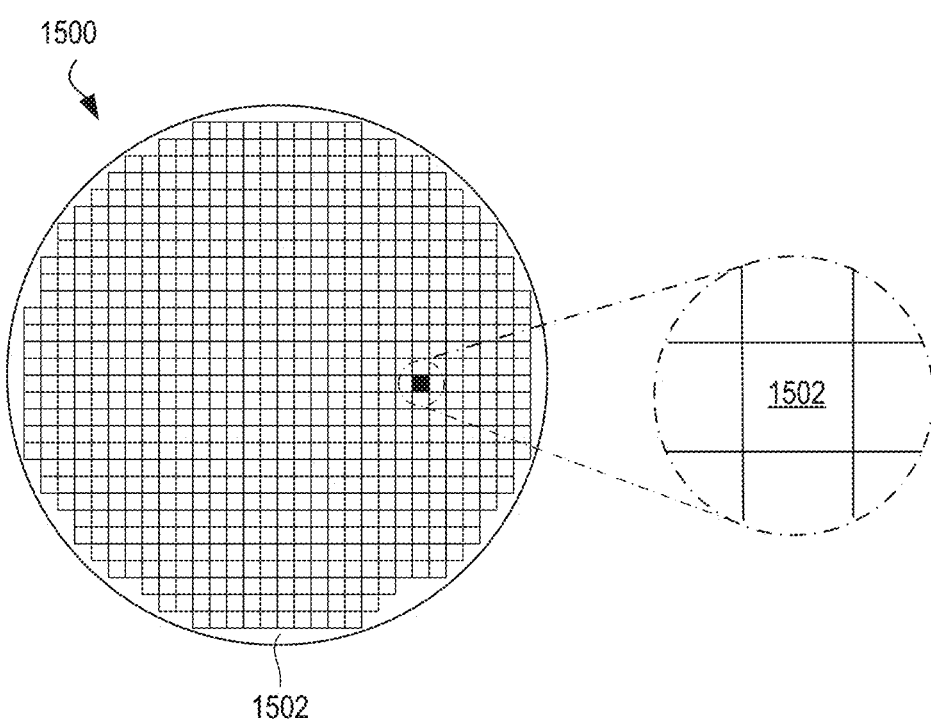
FIG. 15 is a top view of a wafer and dies that may be included in a microelectronic assembly, in accordance with any of the embodiments disclosed herein.

FIG. 15 is a top view of a wafer 1500 and dies 1502 that may be included in any of the embodiments disclosed herein. The wafer 1500 may be composed of semiconductor material and may include one or more dies 1502 formed on a surface of the wafer 1500. After the fabrication of the integrated circuit components on the wafer 1500 is complete, the wafer 1500 may undergo a singulation process in which the dies 1502 are separated from one another to provide discrete "chips" or destined for a packaged integrated circuit component. The individual dies 1502, comprising an integrated circuit component, may include one or more transistors (e.g., some of the transistors 1640 of FIG. 16, discussed below), supporting circuitry to route electrical signals to the transistors, passive components (e.g., signal traces, resistors, capacitors, or inductors), and/or any other integrated circuit components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Additionally, multiple devices may be combined on a single die 1502. For example, a memory array formed by multiple memory devices may be formed on a same die 1502 as a processor unit (e.g., the processor unit 1802 of FIG. 18) or other logic that is configured to store information in the memory devices or execute instructions stored in the memory array. In some embodiments, a die 1502 may be attached to a wafer 1500 that includes other die, and the wafer 1500 is subsequently singulated, this manufacturing procedure is referred to as a die-to-wafer assembly technique.

Figure 16:
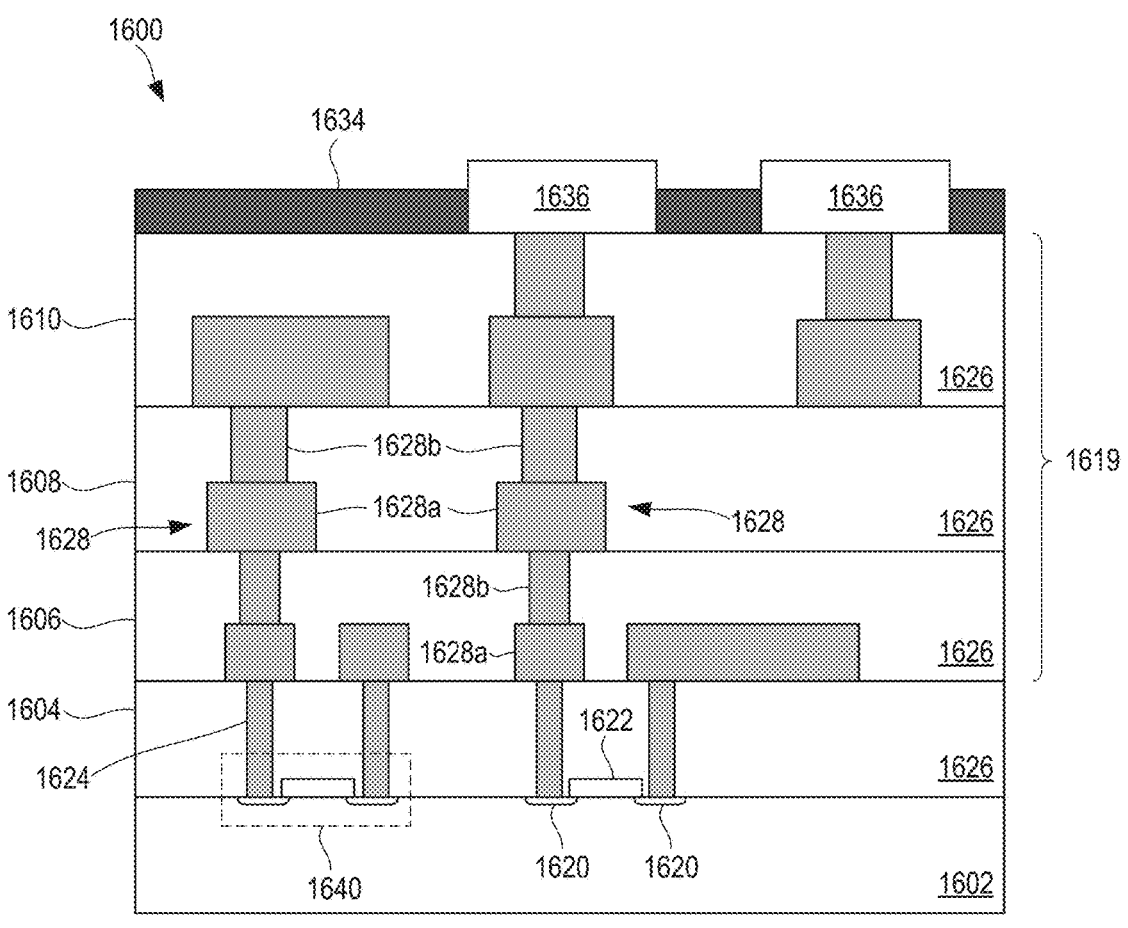
FIG. 16 is a simplified cross-sectional side view showing an implementation of an integrated circuit on a die that may be included in various embodiments, in accordance with any of the embodiments disclosed herein.

FIG. 16 is a cross-sectional side view of an integrated circuit 1600 that may be included in any of the embodiments disclosed herein. One or more of the integrated circuits 1600 may be included in one or more dies 1502 (FIG. 15). The integrated circuit 1600 may be formed on a die substrate 1602 (e.g., the wafer 1500 of FIG. 15) and may be included in a die (e.g., the die 1502 of FIG. 15).

The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an integrated circuit 1600 may be used. The die substrate 1602 may be part of a singulated die (e.g., the dies 1502 of FIG. 15) or a wafer (e.g., the wafer 1500 of FIG. 15).

The integrated circuit 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The transistors 1640 may include, for example, one or more source and/or drain (S/D) regions 1620, a gate 1622 to control current flow between the S/D regions 1620, and one or more S/D contacts 1624 to route electrical signals to/from the S/D regions 1620.

The gate 1622 may be formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be conducted on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may comprise a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may comprise a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may comprise a combination of U-shaped structures and planar, non-U-shaped structures. For example, the gate electrode may comprise one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and include deposition and etching process steps.

In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of individual transistors 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be conducted to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the integrated circuit 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 16. Although a particular number of interconnect layers 1606-1610 is depicted in FIG. 16, embodiments of the present disclosure include integrated circuits having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page and/or in a direction across the page. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 16. In some embodiments, dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same. The device layer 1604 may include a dielectric material 1626 disposed between the transistors 1640 and a bottom layer of the metallization stack as well. The dielectric material 1626 included in the device layer 1604 may have a different composition than the dielectric material 1626 included in the interconnect layers 1606-1610; in other embodiments, the composition of the dielectric material 1626 in the device layer 1604 may be the same as a dielectric material 1626 included in any one of the interconnect layers 1606-1610.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604. The vias 1628b of the first interconnect layer 1606 may be coupled with the lines 1628a of a second interconnect layer 1608.

The second interconnect layer 1608 (referred to as Metal 2 or "M2") may be formed directly on the first interconnect layer 1606. In some embodiments, the second interconnect layer 1608 may include via 1628b to couple the lines 1628 of the second interconnect layer 1608 with the lines 1628a of a third interconnect layer 1610. Although the lines 1628a and the vias 1628b are structurally delineated with a line within individual interconnect layers for the sake of clarity, the lines 1628a and the vias 1628b may be structurally and/or materially contiguous (e.g., simultaneously filled during a dual-damascene process) in some embodiments.

The third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the integrated circuit 1600 (i.e., farther away from the device layer 1604) may be thicker that the interconnect layers that are lower in the metallization stack 1619, with lines 1628a and vias 1628b in the higher interconnect layers being thicker than those in the lower interconnect layers.

The integrated circuit 1600 may include a solder resist material 1634 (e.g., polyimide or similar material) and one or more conductive contacts 1636 formed on the interconnect layers 1606-1610. In FIG. 16, the conductive contacts 1636 are illustrated as taking the form of bond pads. The conductive contacts 1636 may be electrically coupled with the interconnect structures 1628 and configured to route the electrical signals of the transistor(s) 1640 to external devices. For example, solder bonds may be formed on the one or more conductive contacts 1636 to mechanically and/or electrically couple an integrated circuit die including the integrated circuit 1600 with another component (e.g., a printed circuit board). The integrated circuit 1600 may include additional or alternate structures to route the electrical signals from the interconnect layers 1606-1610; for example, the conductive contacts 1636 may include other analogous features (e.g., posts) that route the electrical signals to external components.

In some embodiments in which the integrated circuit 1600 is a double-sided die, the integrated circuit 1600 may include another metallization stack (not shown) on the opposite side of the device layer(s) 1604. This metallization stack may include multiple interconnect layers as discussed above with reference to the interconnect layers 1606-1610, to provide electrically conductive paths (e.g., including conductive lines and vias) between the device layer(s) 1604 and additional conductive contacts (not shown) on the opposite side of the integrated circuit 1600 from the conductive contacts 1636.

In other embodiments in which the integrated circuit 1600 is a double-sided die, the integrated circuit 1600 may include one or more through-silicon vias (TSVs) through the die substrate 1602; these TSVs may make contact with the device layer(s) 1604, and may provide electrically conductive paths between the device layer(s) 1604 and additional conductive contacts (not shown) on the opposite side of the integrated circuit 1600 from the conductive contacts 1636. In some embodiments, TSVs extending through the substrate can be used for routing power and ground signals from conductive contacts on the opposite side of the integrated circuit 1600 from the conductive contacts 1636 to the transistors 1640 and any other components integrated into the die 1600, and the metallization stack 1619 can be used to route I/O signals from the conductive contacts 1636 to transistors 1640 and any other components integrated into the die 1600.

Multiple integrated circuits 1600 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 17:
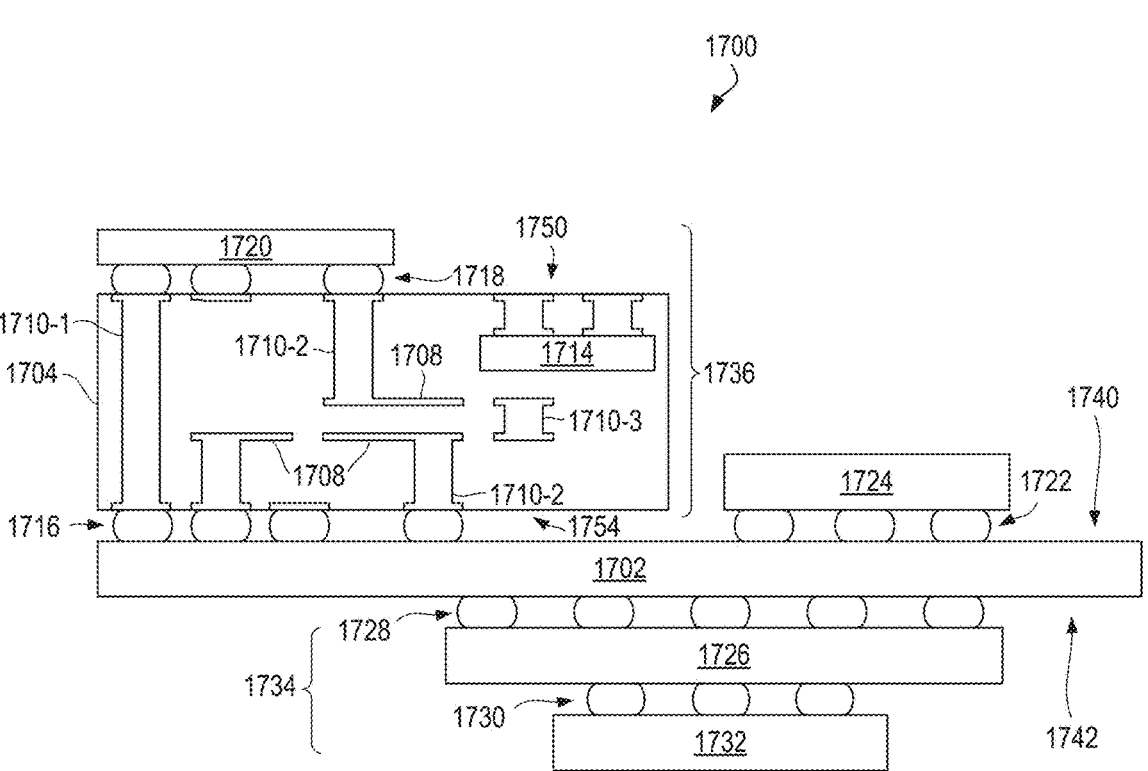
FIG. 17 is a cross-sectional side view of a microelectronic assembly that may include any of the embodiments disclosed herein.

FIG. 17 is a cross-sectional side view of a microelectronic assembly 1700 that may include any of the embodiments disclosed herein. The microelectronic assembly 1700 includes multiple integrated circuit components disposed on a circuit board 1702 (which may be a motherboard, system board, mainboard, etc.). The microelectronic assembly 1700 may include components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. The microelectronic assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1736 may include an integrated circuit component 1720 coupled to an interposer 1704 by coupling components 1718. The coupling components 1718 may take any suitable form for the application, such as the forms discussed above with reference to the coupling components 1716. Although a single integrated circuit component 1720 is shown in FIG. 17, multiple integrated circuit components may be coupled to the interposer 1704; indeed, additional interposers may be coupled to the interposer 1704. The interposer 1704 may provide an intervening substrate used to bridge the circuit board 1702 and the integrated circuit component 1720.

The integrated circuit component 1720 may be a packaged or unpackaged integrated circuit component that includes one or more integrated circuit dies (e.g., the die 1502 of FIG. 15, the integrated circuit 1600 of FIG. 16) and/or one or more other suitable components.

The unpackaged integrated circuit component 1720 comprises solder bumps attached to contacts on the die. The solder bumps allow the die to be directly attached to the interposer 1704. In embodiments where the integrated circuit component 1720 comprises multiple integrated circuit dies, the dies can be of the same type (a homogeneous multi-die integrated circuit component) or of two or more different types (a heterogeneous multi-die integrated circuit component). In addition to comprising one or more processor units, the integrated circuit component 1720 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets." In embodiments where an integrated circuit component comprises multiple integrated circuit dies, interconnections between dies can be provided by the package substrate, one or more silicon interposers, one or more silicon bridges embedded in the package substrate, or combinations thereof. A packaged multi-die integrated circuit component can be referred to as a multi-chip package (MCP) or multi-chip module (MCM).

The interposer 1704 may spread connections to a wider pitch or reroute a connection to a different connection. For example, the interposer 1704 may couple the integrated circuit component 1720 to a set of ball grid array (BGA) conductive contacts of the coupling components 1716 for coupling to the circuit board 1702. In the embodiment illustrated in FIG. 17, the integrated circuit component 1720 and the circuit board 1702 are attached to opposing sides of the interposer 1704; in other embodiments, the integrated circuit component 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through hole vias 1710-1 (that extend from a first face 1750 of the interposer 1704 to a second face 1754 of the interposer 1704), blind vias 1710-2 (that extend from the first or second faces 1750 or 1754 of the interposer 1704 to an internal metal layer), and buried vias 1710-3 (that connect internal metal layers).

In some embodiments, the interposer 1704 can comprise a silicon interposer. Through-silicon vias (TSV) extending through the silicon interposer can connect connections on a first face of a silicon interposer to an opposing second face of the silicon interposer. In some embodiments, an interposer 1704 comprising a silicon interposer can further comprise one or more routing layers to route connections on a first face of the interposer 1704 to an opposing second face of the interposer 1704.

The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In embodiments where the interposer is a non-printed circuit board The integrated circuit assembly 1700 may include an integrated circuit component 1724 coupled to the first face 1740 of the circuit board 1702 by coupling components 1722. The coupling components 1722 may take the form of any of the embodiments discussed above with reference to the coupling components 1716, and the integrated circuit component 1724 may take the form of any of the embodiments discussed above with reference to the integrated circuit component 1720.

The integrated circuit assembly 1700 illustrated in FIG. 17 includes a package-on-package structure 1734 coupled to the second face 1742 of the circuit board 1702 by coupling components 1728. The package-on-package structure 1734 may include an integrated circuit component 1726 and an integrated circuit component 1732 coupled together by coupling components 1730 such that the integrated circuit component 1726 is disposed between the circuit board 1702 and the integrated circuit component 1732. The coupling components 1728 and 1730 may take the form of any of the embodiments of the coupling components 1716 discussed above, and the integrated circuit components 1726 and 1732 may take the form of any of the embodiments of the integrated circuit component 1720 discussed above. The package-on-package structure 1734 may be configured in accordance with any of the package-on-package structures known in the art.

FIG. 18 is a block diagram of an example electrical device 1800 that may include one or more of the embodiments disclosed herein. For example, any suitable ones of the components of the electrical device 1800 may include one or more of the microelectronic assemblies 1700, integrated circuit components 1720, integrated circuits 1600, integrated circuit dies 1502, or structures disclosed herein. A number of components are illustrated in FIG. 18 as included in the electrical device 1800, but any one or more of these components may be omitted or duplicated, as suitable for the application. In some embodiments, some or all the components included in the electrical device 1800 may be attached to one or more motherboards, mainboards, printed circuit boards, or system boards. In some embodiments, one or more of these components are fabricated onto a single system-on-a-chip (SoC) die. In various embodiments, the electrical device 3000 is enclosed by, or integrated with, a housing.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include one or more processor units 1802 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1802 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller crypto processors (specialized processors that execute cryptographic algorithms within hardware), server processors, controllers, or any other suitable type of processor units. As such, the processor unit can be referred to as an XPU (or xPU).

The electrical device 1800 may include a memory 1804, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 1804 may include memory that is located on the same integrated circuit die as the processor unit 1802. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 1800 can comprise one or more processor units 1802 that are heterogeneous or asymmetric to another processor unit 1802 in the electrical device 1800. There can be a variety of differences between the processor units 1802 in a system in terms of a spectrum of metrics of merit including architectural, microarchitectural, thermal, power consumption characteristics, and the like. These differences can effectively manifest themselves as asymmetry and heterogeneity among the processor units 1802 in the electrical device 1800.

In some embodiments, the electrical device 1800 may include a communication component 1812 (e.g., one or more communication components). For example, the communication component 1812 can manage wireless communications for the transfer of data to and from the electrical device 1800. The term "wireless" and its derivatives may be used to describe circuits, devices, systems, methods, techniques, communications channels, etc., that may communicate data using modulated electromagnetic radiation through a nonsolid medium. The term "wireless" does not imply that the associated devices do not contain any wires, although in some embodiments they might not.

The communication component 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication component 1812 may manage wired communications, such as electrical, optical, or any other suitable communication protocols (e.g., IEEE 802.3 Ethernet standards). As noted above, the communication component 1812 may include multiple communication components. For instance, a first communication component 1812 may be dedicated to shorter-range wireless communications such as Wi-Fi or Bluetooth, and a second communication component 1812 may be dedicated to longer-range wireless communications such as global positioning system (GPS), EDGE, GPRS, CDMA, WiMAX, LTE, EV-DO, or others. In some embodiments, a first communication component 1812 may be dedicated to wireless communications, and a second communication component 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any embedded or wired or wirelessly connected external device that generates an audible indicator, such speakers, headsets, or earbuds.

The electrical device 1800 may include an audio input device 1824 (or corresponding interface circuitry, as discussed above). The audio input device 1824 may include any embedded or wired or wirelessly connected device that generates a signal representative of a sound, such as microphones, microphone arrays, or digital instruments (e.g., instruments having a musical instrument digital interface (MIDI) output). The electrical device 1800 may include a Global Navigation Satellite System (GNSS) device 1818 (or corresponding interface circuitry, as discussed above), such as a Global Positioning System (GPS) device. The GNSS device 1818 may be in communication with a satellite-based system and may determine a geolocation of the electrical device 1800 based on information received from one or more GNSS satellites, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1800 may be any other electronic device that processes data. In some embodiments, the electrical device 1800 may comprise multiple discrete physical components. Given the range of devices that the electrical device 1800 can be manifested as in various embodiments, in some embodiments, the electrical device 1800 can be referred to as a computing device or a computing system.

Thus, embodiments of an improved via structure for use with the embedded component have been provided. The provided embodiments advantageously enable the use of finer pitch architectures and high-density input/output (I/O) designs in multi-chip packaging.

While at least one embodiment has been presented in the foregoing detailed description, it should be appreciated that a vast number of variations exist. It should also be appreciated that the disclosed embodiments are only examples, and are not intended to limit the scope, applicability, or configuration of the disclosure in any way. Rather, the foregoing detailed description will provide those skilled in the art with a convenient road map for implementing the disclosed embodiment embodiments. Various changes can be made in the function and arrangement of elements without departing from the scope of the disclosure as set forth in the appended claims and the legal equivalents thereof.

As used herein, phrases such as "an embodiment," "various embodiments," "some embodiments," and the like, indicate that some embodiments may have some, all, or none of the features described for other embodiments. "First," "second," "third," and the like describe a common object and indicate different instances of like objects being referred to; unless specifically stated, they do not imply a given sequence, either temporally or spatially, in ranking, or any other manner. In accordance with patent application parlance, "connected" indicates elements that are in direct physical or electrical contact with each other and "coupled" indicates elements that co-operate or interact with each other, coupled elements may or may not be in direct physical or electrical contact. Furthermore, the terms "comprising," "including," "having," and the like, are utilized synonymously to denote non-exclusive inclusions.

As used in this application and the claims, a list of items joined by the term "at least one of" or the term "one or more of" can mean any combination of the listed terms. For example, the phrase "at least one of A, B or C" can mean A; B; C; A and B; A and C; B and C; or A, B, and C. Likewise, the phrase "one or more of A, B and C" can mean A; B; C; A and B; A and C; B and C; or A, B, and C.

As used in this application and the claims, the phrase "individual of" or "respective of" following by a list of items recited or stated as having a trait, feature, etc. means that all the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

EXAMPLES

Example 1 is an apparatus, including: a glass layer having an upper surface, a lower surface, and a plurality of through-glass vias (TGVs) traversing from the upper surface to the lower surface; the TGVs substantially filled with a conductive material; a local interconnect component attached to the upper surface of the glass layer via an attachment means, the local interconnect component having an upper surface with a first conductive contact and a second conductive contact, the first conductive contact being in electrical communication with the second conductive contact, the local interconnect component further being positioned over a first TGV of the plurality of TGVs; a mold layer located on the upper surface of the glass layer and substantially surrounding the local interconnect component, the mold layer having an upper surface; the first conductive contact and second conductive contact exposed at the upper surface of the mold layer; a conductive pillar positioned over a second TGV of the plurality of TGVs and extending from the upper surface of the glass layer to the upper surface of the mold layer, the conductive pillar being exposed at the upper surface of the mold layer; a first die attached to the first conductive contact and conductive pillar; and a second die attached to the second conductive contact.

Example 2 is an apparatus, comprising: a glass layer having an upper surface, a lower surface, and a plurality of through-glass vias (TGVs) traversing from the upper surface to the lower surface; the TGVs substantially filled with a conductive material; a local interconnect component attached to the upper surface of the glass layer via hybrid bonding to a first TGV of the plurality of TGVs, the local interconnect component having an upper surface with a first conductive contact and a second conductive contact, the first conductive contact being in electrical communication with the second conductive contact; a mold layer located on the upper surface of the glass layer and substantially surrounding the local interconnect component, the mold layer having an upper surface; the first conductive contact and second conductive contact being exposed at the upper surface of the mold layer; a conductive pillar positioned over a second TGV of the plurality of TGVs and extending from the upper surface of the glass layer to the upper surface of the mold layer, the conductive pillar being exposed at the upper surface of the mold layer; a first die attached to the first conductive contact and conductive pillar; and a second die attached to the second conductive contact.

Example 3 is an apparatus including: a glass layer having an upper surface, a lower surface, and a plurality of through-glass vias (TGVs) traversing from the upper surface to the lower surface; the TGVs substantially filled with a conductive material; a local interconnect component attached to the upper surface of the glass layer via a bond film to a first TGV of the plurality of TGVs, the local interconnect component having an upper surface with a first conductive contact and a second conductive contact, the first conductive contact being in electrical communication with the second conductive contact; a mold layer located on the upper surface of the glass layer and substantially surrounding the local interconnect component, the mold layer having an upper surface; the first conductive contact and second conductive contact being exposed at the upper surface of the mold layer; a conductive pillar positioned over a second TGV of the plurality of TGVs and extending from the upper surface of the glass layer to the upper surface of the mold layer, the conductive pillar being exposed at the upper surface of the mold layer; a first die attached to the first conductive contact and conductive pillar; and a second die attached to the second conductive contact.

Example 4 is an apparatus including: a glass layer having an upper surface, a lower surface, and a plurality of through-glass vias (TGVs) traversing from the upper surface to the lower surface; the TGVs substantially filled with a conductive material; a local interconnect component attached to the upper surface of the glass layer via solder and underfill to a first TGV of the plurality of TGVs, the local interconnect component having an upper surface with a first conductive contact and a second conductive contact, the first conductive contact being in electrical communication with the second conductive contact; a mold layer located on the upper surface of the glass layer and substantially surrounding the local interconnect component, the mold layer having an upper surface; the first conductive contact and second conductive contact being exposed at the upper surface of the mold layer; a conductive pillar positioned over a second TGV of the plurality of TGVs and extending from the upper surface of the glass layer to the upper surface of the mold layer, the conductive pillar being exposed at the upper surface of the mold layer; a first die attached to the first conductive contact and conductive pillar; and a second die attached to the second conductive contact.

Example 5 includes the subject matter of any one of Examples 1-4, further comprising a solder resist layer located on the upper surface of the mold layer and patterned to expose the first conductive contact, second conductive contact, and conductive pillar.

Example 6 includes the subject matter of any one of Examples 1-4, further comprising underfill between the first die and upper surface of the mold layer and underfill between the second die and the upper surface of the mold layer.

Example 7 includes the subject matter of any one of Examples 1-4, wherein the local interconnect component is a photonic integrated circuit or memory component).

Example 8 includes the subject matter of any one of Examples 1-4, wherein the local interconnect component further has a through-silicon via (TSV) that connects to a third TGV of the plurality of TGVs and the first die further connects to the third TGV via the TSV.

Example 9 includes the subject matter of any one of Examples 1-4, wherein the glass layer comprises aluminum, oxygen, boron, silicon.

Example 10 includes the subject matter of any one of Examples 1-4, wherein the glass layer comprises lithium, silicon, and oxygen.

Example 11 includes the subject matter of any one of Examples 1-4, wherein the conductive material comprises copper, aluminum, nickel, cobalt, iron, tin, gold, or silver.

Example 12 includes the subject matter of any one of Examples 1-4, further comprising a solder resist layer located on the lower surface of the glass layer and patterned to expose the TGVs.

Example 13 includes the subject matter of any one of Examples 1-4, further comprising a package substrate attached to the lower surface of the glass layer via mid-level interconnect (MU).

Example 14 includes the subject matter of any one of Examples 1-4, further comprising a redistribution layer located on the upper surface of the mold layer, the redistribution layer having therein respective interconnect structures attached to the first conductive contact, the second conductive contact, and the conductive pillar.

Example 15 includes the subject matter of any one of Examples 1-4, wherein the first conductive contact is one of a plurality of conductive contacts arranged at a fine pitch.

Example 16 includes the subject matter of any one of Examples 1-4, wherein the TGVs are arranged at a coarse pitch.

Example 17 includes the subject matter of any one of Examples 1-4, further comprising a redistribution layer located under the lower surface of the glass layer, the redistribution layer having therein respective interconnect structures attached to the TGVs.

Example 18 includes the subject matter of any one of Examples 1-4, further comprising: a package substrate attached to the lower surface of the glass layer via mid-level interconnect (MU); and a thermal solution attached to the apparatus.

Example 19 includes the subject matter of any one of Examples 1-4, further comprising: a package substrate attached to the lower surface of the glass layer via mid-level interconnect (MU); and a housing at least partially enclosing the package substrate.

Example 20 is a method, including: patterning a glass layer having an upper surface and a lower surface with a plurality of through-glass vias (TGVs); substantially filling the TGVs with a conductive material; forming a copper pillar on the upper surface of the glass layer, positioned over a first TGV of the plurality of TGVs; attaching a local interconnect component to the upper surface of the glass layer, positioned over a second TGV of the plurality of TGVs, the local interconnect component having an upper surface with a first conductive contact and a second conductive contact, the first conductive contact being in electrical communication with the second conductive contact; overlaying the upper surface of the glass layer, copper pillar, and local interconnect component with a mold; planarizing the mold to expose a top of the copper pillar, the first conductive contact and the second conductive contact; attaching a first die to the first conductive contact and the copper pillar; and attaching a second die to the second conductive contact.

Example 21 includes the subject matter of Example 20, further comprising attaching a package substrate to the plurality of TGVs at the lower surface of the glass layer.

What is claimed is:

1. An apparatus, comprising:
a glass layer having an upper surface, a lower surface, and a plurality of through-glass vias (TGVs) traversing from the upper surface to the lower surface;
the TGVs substantially filled with a conductive material;
a local interconnect component attached to the upper surface of the glass layer via an attachment means, the local interconnect component having an upper surface with a first conductive contact and a second conductive contact, the first conductive contact being in electrical communication with the second conductive contact, the local interconnect component further being positioned over a first TGV of the plurality of TGVs;
a mold layer located on the upper surface of the glass layer and adjacent to the local interconnect component, the mold layer having an upper surface co-planar with the upper surface of the local interconnect component;
the first conductive contact and second conductive contact exposed at the upper surface of the local interconnect component;
a conductive pillar positioned over a second TGV of the plurality of TGVs and extending from the upper surface of the glass layer to the upper surface of the mold layer, the conductive pillar being exposed at the upper surface of the mold layer;

a first die attached to the first conductive contact and the conductive pillar; and a second die attached to the second conductive contact.

2. The apparatus of claim 1, further comprising a solder resist layer located on the upper surface of the mold layer and patterned to expose the first conductive contact, second conductive contact, and conductive pillar.

3. The apparatus of claim 1, further comprising underfill between the first die and upper surface of the mold layer and underfill between the second die and the upper surface of the mold layer.

4. The apparatus of claim 1, wherein the local interconnect component is a silicon bridge.

5. The apparatus of claim 1, wherein the local interconnect component further has a through-silicon via (TSV) that connects to a third TGV of the plurality of TGVs and the first die further connects to the third TGV via the TSV.

6. The apparatus of claim 1, further comprising a package substrate attached to the TGVs at the lower surface of the glass layer.

7. The apparatus of claim 1, further comprising a redistribution layer located on the upper surface of the mold layer, the redistribution layer having therein respective interconnect structures attached to the first conductive contact, the second conductive contact, and the conductive pillar.

8. The apparatus of claim 1, further comprising a redistribution layer located under the lower surface of the glass layer, the redistribution layer having therein respective interconnect structures attached to the TGVs.

9. The apparatus of claim 1, further comprising:

a package substrate attached to the lower surface of the glass layer; and a thermal solution attached to the apparatus.

10. The apparatus of claim 1, wherein the upper surface of the local interconnect component is not in contact with the mold layer.

11. The apparatus of claim 1, wherein the mold layer laterally surrounds the local interconnect component.

12. An apparatus, comprising:

a glass layer having an upper surface, a lower surface, and a plurality of through-glass vias (TGVs) traversing from the upper surface to the lower surface;

the TGVs substantially filled with a conductive material;

a local interconnect component attached to the upper surface of the glass layer via hybrid bonding to a first TGV of the plurality of TGVs, the local interconnect component having an upper surface with a first conductive contact and a second conductive contact, the first conductive contact being in electrical communication with the second conductive contact;

a mold layer located on the upper surface of the glass layer and adjacent to the local interconnect component, the mold layer having an upper surface co-planar with the upper surface of the local interconnect component;

the first conductive contact and second conductive contact being exposed at the upper surface of the local interconnect component;

a conductive pillar positioned over a second TGV of the plurality of TGVs and extending from the upper surface of the glass layer to the upper surface of the mold layer, the conductive pillar being exposed at the upper surface of the mold layer;

a first die attached to the first conductive contact and conductive pillar; and a second die attached to the second conductive contact.

13. The apparatus of claim 12, wherein the local interconnect component is a silicon bridge.

14. The apparatus of claim 12, wherein the local interconnect component further has a through-silicon via (TSV) that connects to a third TGV of the plurality of TGVs and the first die further connects to the third TGV via the TSV.

15. The apparatus of claim 12, further comprising a package substrate attached to the TGVs at the lower surface of the glass layer.

16. The apparatus of claim 12, further comprising a solder resist layer located on the upper surface of the mold layer and patterned to expose the first conductive contact, second conductive contact, and conductive pillar.

17. The apparatus of claim 12, further comprising underfill between the first die and upper surface of the mold layer and underfill between the second die and the upper surface of the mold layer.

18. An apparatus, comprising:

a glass layer having an upper surface, a lower surface, and a plurality of through-glass vias (TGVs) traversing from the upper surface to the lower surface;

the TGVs substantially filled with a conductive material;

a local interconnect component attached to the upper surface of the glass layer via a bond film to a first TGV of the plurality of TGVs, the local interconnect component having an upper surface with a first conductive contact and a second conductive contact, the first conductive contact being in electrical communication with the second conductive contact;

a mold layer located on the upper surface of the glass layer and adjacent to the local interconnect component, the mold layer having an upper surface co-planar with the upper surface of the local interconnect component;

the first conductive contact and second conductive contact being exposed at the upper surface of the local interconnect component;

a conductive pillar positioned over a second TGV of the plurality of TGVs and extending from the upper surface of the glass layer to the upper surface of the mold layer, the conductive pillar being exposed at the upper surface of the mold layer;

a first die attached to the first conductive contact and conductive pillar; and a second die attached to the second conductive contact.

19. The apparatus of claim 18, wherein the local interconnect component is a silicon bridge.

20. The apparatus of claim 18, wherein the local interconnect component further has a through-silicon via (TSV) that connects to a third TGV of the plurality of TGVs and the first die further connects to the third TGV via the TSV.

21. The apparatus of claim 18, further comprising a package substrate attached to the TGVs at the lower surface of the glass layer.

22. The apparatus of claim 18, further comprising a solder resist layer located on the upper surface of the mold layer and patterned to expose the first conductive contact, second conductive contact, and conductive pillar.

23. The apparatus of claim 18, further comprising underfill between the first die and upper surface of the mold layer and underfill between the second die and the upper surface of the mold layer.

24. A method, comprising:

patterning a glass layer having an upper surface and a lower surface with a plurality of through-glass vias (TGVs);

substantially filling the TGVs with a conductive material;

forming a copper pillar on the upper surface of the glass layer, positioned over a first TGV of the plurality of TGVs;

attaching a local interconnect component to the upper surface of the glass layer, positioned over a second TGV of the plurality of TGVs, the local interconnect component having an upper surface with a first conductive contact and a second conductive contact, the first conductive contact being in electrical communication with the second conductive contact;

overlaying the upper surface of the glass layer, copper pillar, and local interconnect component with a mold;

planarizing the mold to expose a top of the copper pillar, the first conductive contact and the second conductive contact, and the upper surface of the local interconnect component;

attaching a first die to the first conductive contact and the copper pillar; and attaching a second die to the second conductive contact.

25. The method of claim 24, further comprising:

attaching a package substrate to the plurality of TGVs at the lower surface of the glass layer.

* * * * *